United States Patent
Meiser et al.

(10) Patent No.: US 9,941,349 B2
(45) Date of Patent: Apr. 10, 2018

(54) SUPERJUNCTION SEMICONDUCTOR DEVICE WITH OPPOSITELY DOPED SEMICONDUCTOR REGIONS FORMED IN TRENCHES

(71) Applicant: Infineon Technologies Austria AG, Villach (AT)

(72) Inventors: Andreas Meiser, Sauerlach (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/280,799

(22) Filed: Sep. 29, 2016

(65) Prior Publication Data

US 2017/0092717 A1   Mar. 30, 2017

(30) Foreign Application Priority Data

Sep. 30, 2015   (DE) .................. 10 2015 116 576

(51) Int. Cl.

| | |
|---|---|
| *H01L 29/66* | (2006.01) |
| *H01L 29/06* | (2006.01) |
| *H01L 21/02* | (2006.01) |
| *H01L 21/308* | (2006.01) |
| *H01L 29/10* | (2006.01) |
| *H01L 29/78* | (2006.01) |

(52) U.S. Cl.
CPC ...... *H01L 29/0634* (2013.01); *H01L 21/0243* (2013.01); *H01L 21/02639* (2013.01); *H01L 21/3086* (2013.01); *H01L 29/0696* (2013.01); *H01L 29/1095* (2013.01); *H01L 29/66712* (2013.01); *H01L 29/7802* (2013.01)

(58) Field of Classification Search
CPC ............ H01L 29/0634; H01L 29/7802; H01L 29/66712; H01L 29/0696; H01L 29/1095
See application file for complete search history.

(56) References Cited

U.S. PATENT DOCUMENTS

| | | | | |
|---|---|---|---|---|
| 5,216,275 | A * | 6/1993 | Chen ................... | H01L 29/0634 257/266 |
| 6,103,578 | A * | 8/2000 | Uenishi ............. | H01L 21/26546 257/E21.146 |
| 6,291,856 | B1 * | 9/2001 | Miyasaka ........... | H01L 29/0634 257/335 |
| 6,551,909 | B1 * | 4/2003 | Fujihira .............. | H01L 29/0619 257/E21.383 |

(Continued)

FOREIGN PATENT DOCUMENTS

| | | |
|---|---|---|
| DE | 102004010676 A1 | 10/2004 |
| DE | 102014100883 A1 | 8/2014 |

*Primary Examiner* — Kyoung Lee
*Assistant Examiner* — Christina Sylvia
(74) *Attorney, Agent, or Firm* — Murphy, Bilak & Homiller, PLLC

(57) ABSTRACT

A trench etch mask is formed on a process surface of a semiconductor layer. By using the trench etch mask, both first trenches and second trenches are formed that extend from the process surface into the semiconductor layer. The first and second trenches alternate along at least one horizontal direction parallel to the process surface. First semiconductor regions of a first conductivity type are formed in the first trenches. Second semiconductor regions of a second, opposite conductivity type are formed in the second trenches.

9 Claims, 20 Drawing Sheets

(56) References Cited

U.S. PATENT DOCUMENTS

| | | |
|---|---|---|
| 7,541,260 B2 | 6/2009 | Pfirsch et al. |
| 2008/0246079 A1 | 10/2008 | Saito et al. |
| 2011/0244664 A1* | 10/2011 | Liu .................... H01L 21/0245 |
| | | 438/478 |

* cited by examiner

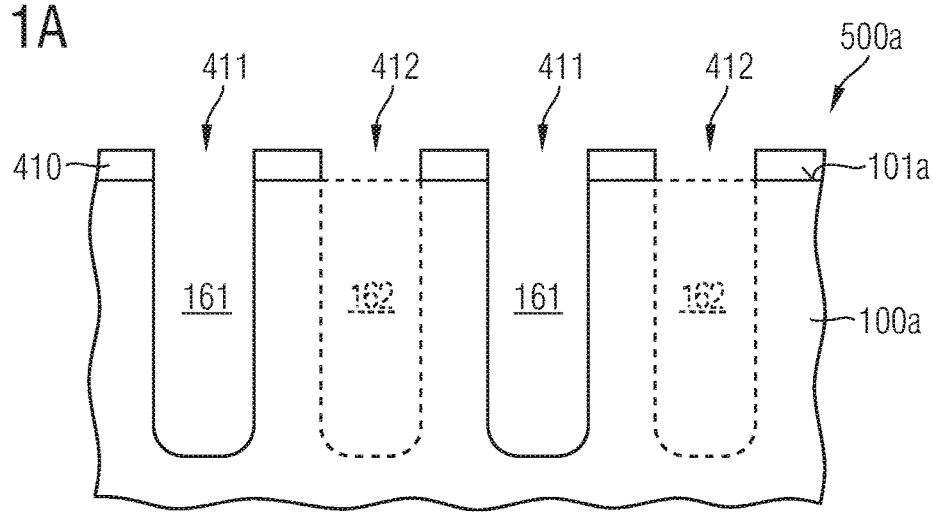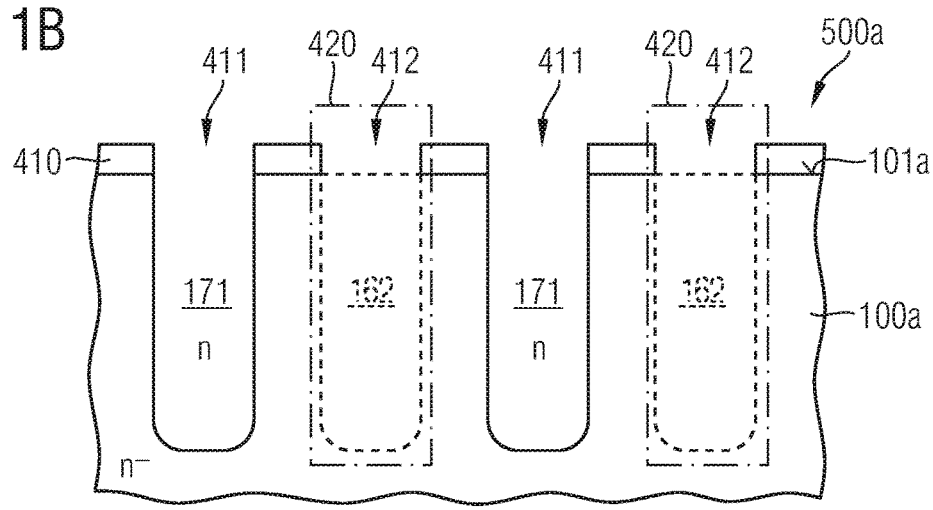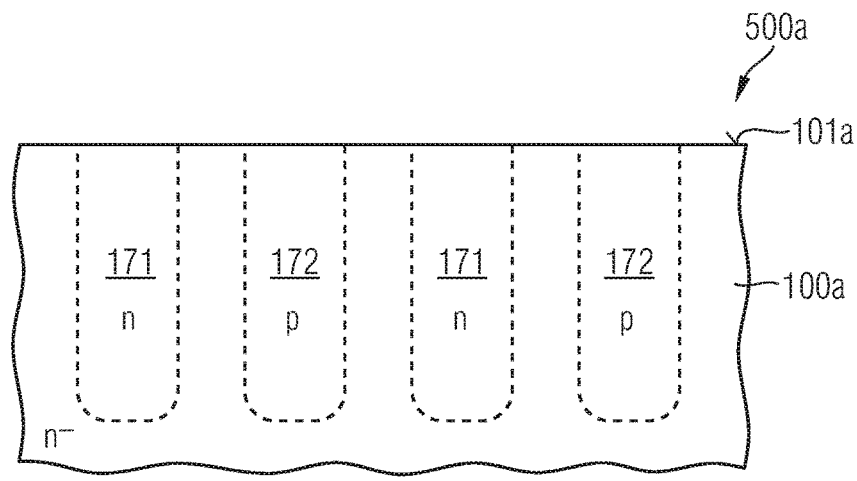

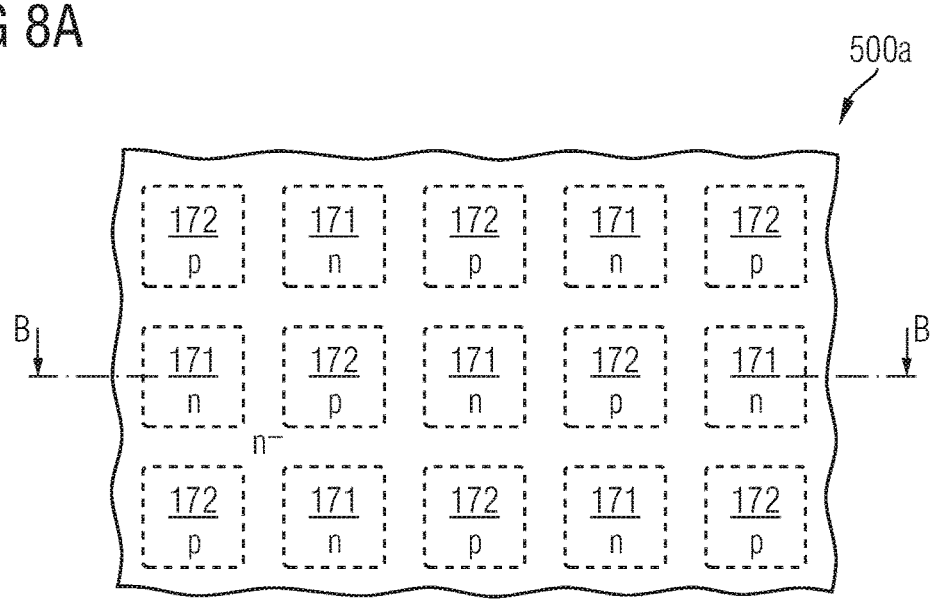
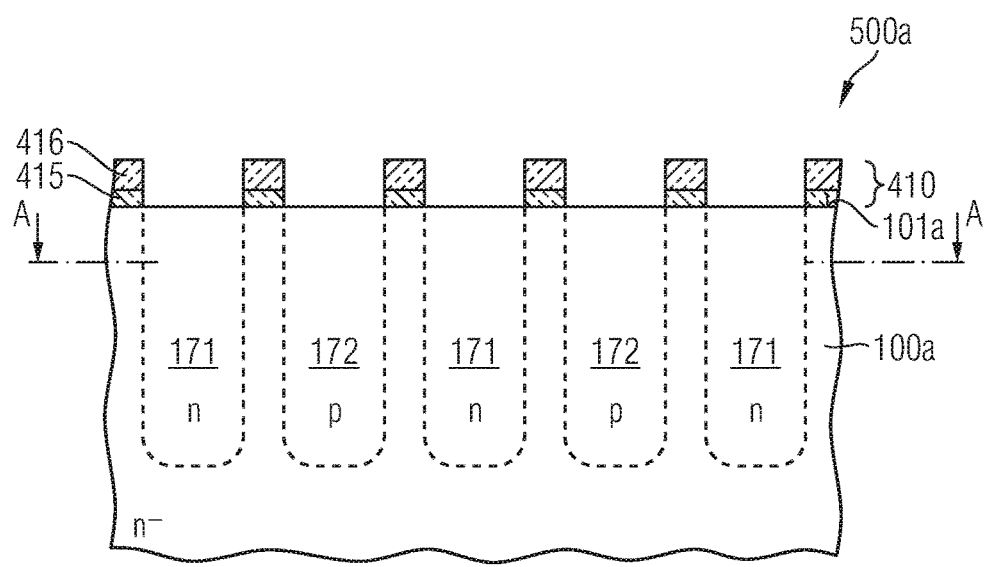

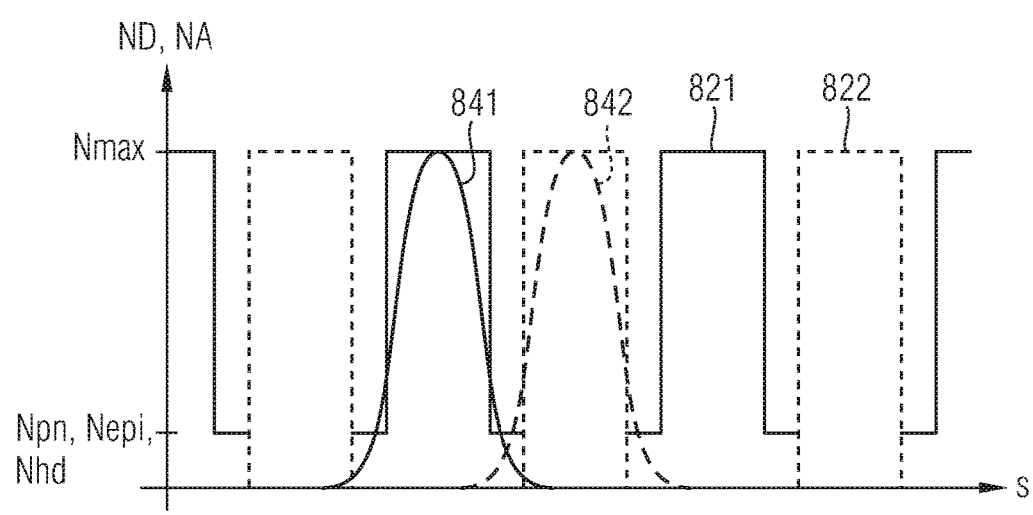

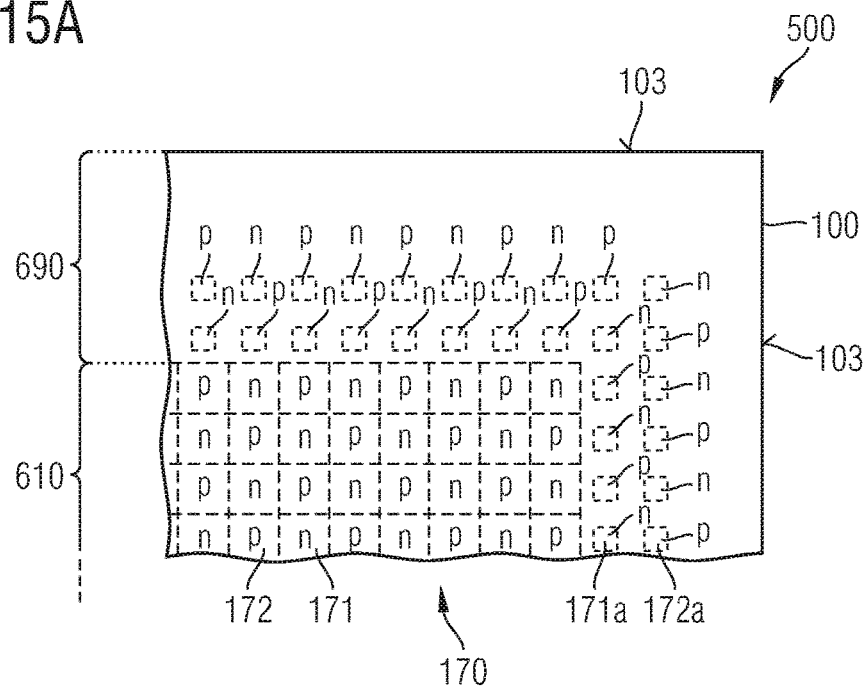
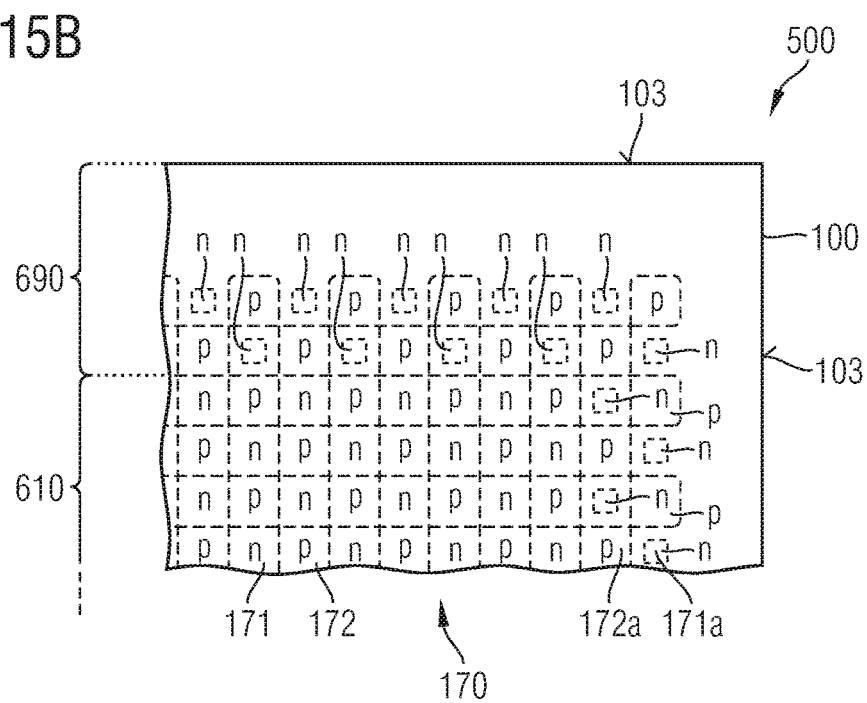

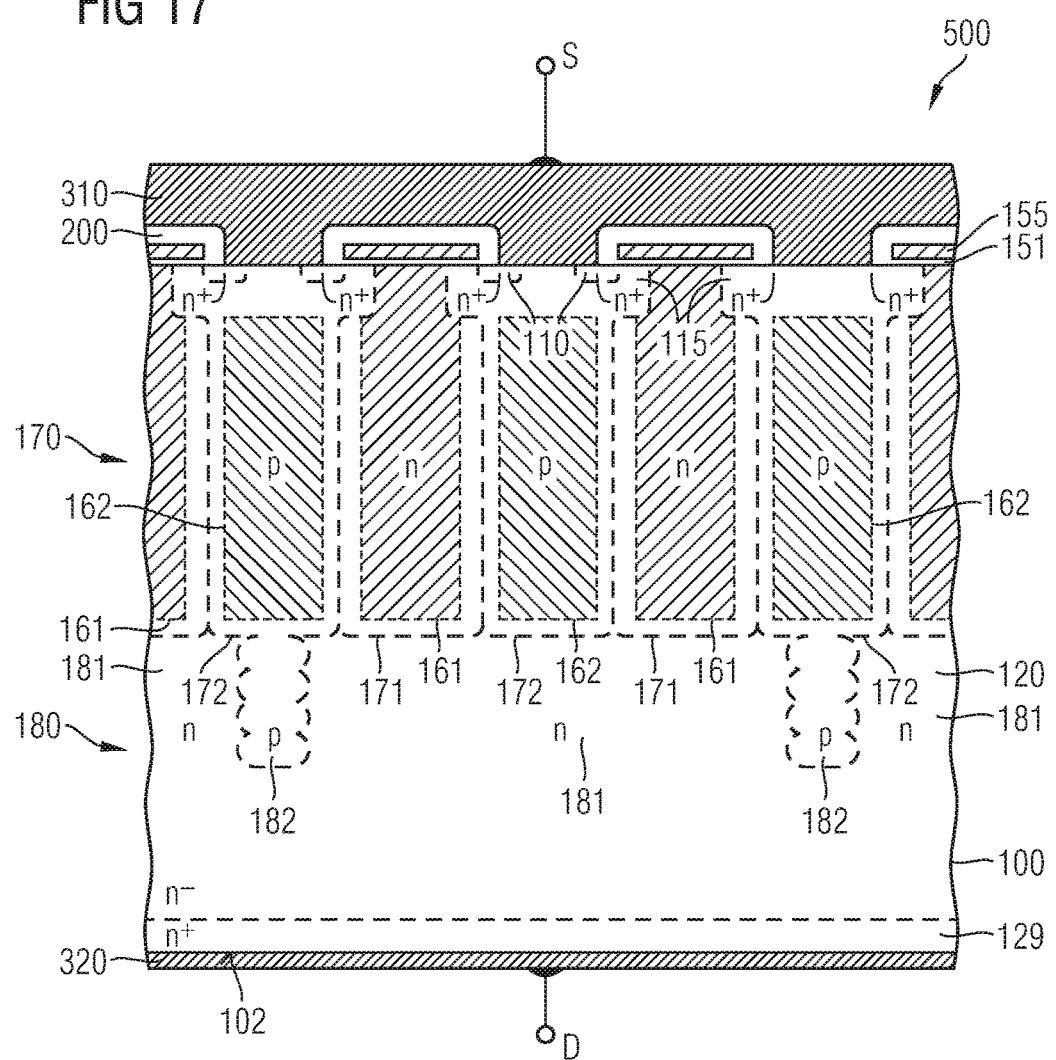

SUPERJUNCTION SEMICONDUCTOR DEVICE WITH OPPOSITELY DOPED SEMICONDUCTOR REGIONS FORMED IN TRENCHES

BACKGROUND

In superjunction devices, oppositely doped semiconductor regions formed in a drift layer effectively cancel out their mobile charge and the resulting depleted region supports high voltage during off-state even at comparatively high dopant concentrations the semiconductor regions. On the other hand the high doping of the doped semiconductor regions ensures low on-state resistance. Typically, manufacture of superjunction devices includes growing n-type epitaxy layers and implanting p-type impurities in each epitaxy layer before forming the next n-type epitaxy layer. A less elaborate approach includes etching trenches in an n-doped epitaxial layer and filling the trenches with p-type semiconductor material. Since with the conventional trench approach further parameters such as trench width and trench taper influence a degree of compensation between the p-type and n-type semiconductor regions, device parameters of superjunction devices based on the trench approach typically show significant fluctuations. Forming the n-type and p-type semiconductor regions from thin p-doped and n-doped layers deposited along sidewalls of trenches results in significant interdiffusion between the dopants. In the interdiffused regions charge carrier mobility is reduced and therefore the on-state resistance comparatively high.

It is desirable to reduce manufacturing costs of superjunction devices without adverse impact on the device parameters.

SUMMARY

According to an embodiment, a method of manufacturing a semiconductor device includes forming a trench etch mask on a process surface of a semiconductor layer. By using the trench etch mask, both first trenches and second trenches are formed that extend from the process surface into the semiconductor layer. The first and second trenches alternate along at least one horizontal direction parallel to the process surface. First semiconductor regions of a first conductivity type are formed in the first trenches and second semiconductor regions of a second, opposite conductivity type are formed in the second trenches.

According to another embodiment, a super junction semiconductor device includes a semiconductor portion that includes a drift layer with first semiconductor regions of a first conductivity and second semiconductor regions of an opposite second conductivity type. The first and second semiconductor regions alternate along at least one horizontal direction parallel to a first surface of the semiconductor portion. Surfaces that connect points of equal dopant concentration in the first and second semiconductor regions are not undulated. At half a distance between vertical center axes of directly adjoining first and second semiconductor regions a concentration of dopants of the first conductivity type is at most 30% of a maximum dopant concentration in the first semiconductor regions.

According to a further embodiment, a method of manufacturing a semiconductor device includes forming a trench etch mask on a process surface of a semiconductor layer. The trench etch mask includes first mask openings and second openings, wherein the first and second mask openings alternate along at least one horizontal direction parallel to the process surface. In the semiconductor layer, first trenches are formed in the vertical projection of the first mask openings and second trenches are formed in the vertical projection of the second mask openings. First semiconductor regions of a first conductivity type are formed in the first trenches and second semiconductor regions of a second conductivity type are formed in the second trenches.

According to a further embodiment, a super junction semiconductor device includes a semiconductor portion that includes a drift layer with first semiconductor regions of a first conductivity and second semiconductor regions of an opposite second conductivity type. The first and second semiconductor regions alternate along at least one horizontal direction parallel to a first surface of the semiconductor portion. Surfaces that connect points of equal dopant concentration in the first and second semiconductor regions are not undulated. At a pn junction between directly adjoining first and second semiconductor regions a concentration of dopants of the first conductivity type is at most 30% of a maximum dopant concentration in the first semiconductor regions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic vertical cross-sectional view of a portion of a semiconductor substrate for illustrating a method of manufacturing a superjunction semiconductor device according to an embodiment using a single trench etch mask for forming first and second trenches, after forming the first and second trenches.

FIG. 1B is a schematic vertical cross-sectional view of the semiconductor substrate portion of FIG. 1A, after selectively forming first semiconductor regions in the first trenches by using a differentiator mask.

FIG. 1C is a schematic vertical cross-sectional view of the semiconductor substrate portion of FIG. 1B, after forming second semiconductor regions in the second trenches.

FIG. 8A is a schematic horizontal cross-sectional view of the semiconductor substrate portion of FIG. 7A, after forming second semiconductor regions in the second trenches.

FIG. 8B is a schematic vertical cross-sectional view of the semiconductor substrate portion of FIG. 8A along line B-B.

FIG. 12C is a diagram schematically illustrating normalized dopant profiles along line B-B of FIG. 12A according to an embodiment based on widely spaced trenches.

FIG. 15A is a schematic horizontal cross-sectional view of a portion of a semiconductor device according to an embodiment based on trenches, which horizontal cross-sectional areas for both first and second semiconductor regions in an edge region decrease with decreasing distance to a lateral surface.

FIG. 15B is a schematic horizontal cross-sectional view of a portion of a semiconductor device according to an embodiment with the horizontal cross-sectional areas of trenches for one of the first and second semiconductor regions in the edge region decreasing with respect to the cross-sectional areas of trenches for the other of the first and second semiconductor regions with decreasing distance to a lateral surface.

FIG. 17 is a schematic vertical cross-sectional view of a portion of a semiconductor device according to an embodiment including a stacked super junction structure with differently formed semiconductor regions.

DETAILED DESCRIPTION

Figure 2A:
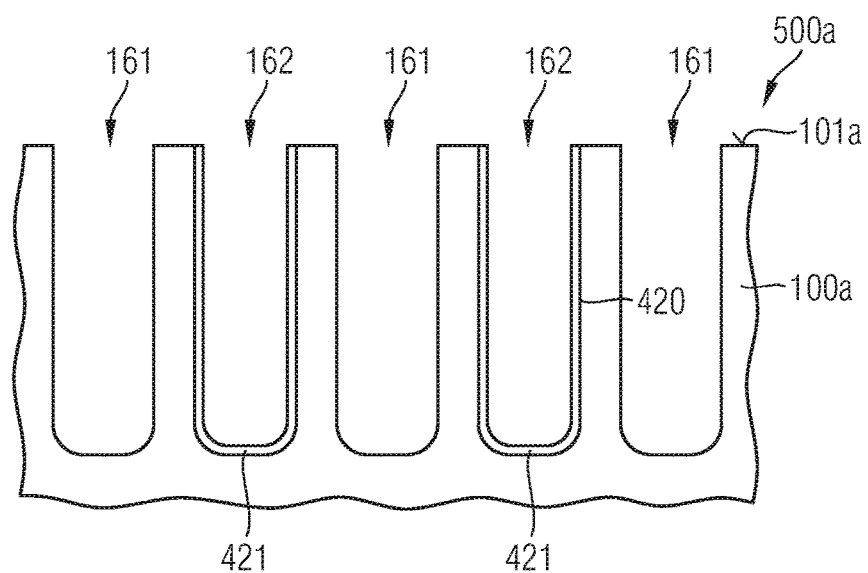
FIG. 2A is a schematic vertical cross-sectional view of a portion of a semiconductor substrate according to an embodiment using a passivation liner mask lining the second trenches as differentiator mask.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or a highly doped semiconductor. The term "electrically coupled" includes that one or more intervening element (s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1C refer to the manufacture of a superjunction semiconductor device with complementary doped semiconductor regions formed in trenches defined by the same trench etch mask.

A trench etch mask layer is formed on a process surface 101a at a front side of a semiconductor substrate 500a that consists of or includes a semiconductor layer 100a of a crystalline semiconductor material. The semiconductor substrate 500a may be a semiconductor wafer from which a plurality of identical semiconductor dies is obtained. Apart from the semiconductor layer 100a, the semiconductor substrate 500a may include further semiconducting portions, for example a heavily doped substrate portion directly adjoining the semiconductor layer 100a on the back, or an insulator portion.

The semiconductor material of the semiconductor layer 100a may be silicon (Si), silicon carbide (SiC), germanium (Ge), silicon germanium (SiGe) or any other $A_{III}B_V$ semiconductor. The semiconductor layer 100a may be a layer grown by epitaxy on a single crystalline substrate portion. The semiconductor layer 100a may be intrinsic or lightly doped. For example, the semiconductor layer 100a is n-doped and contains phosphorus (P) and/or arsenic (As) atoms. A dopant concentration in the semiconductor layer 100a may be approximately uniform or may slightly increase or decrease with increasing distance to the process surface 101a. According to another embodiment, the intrinsic dopant concentration in the semiconductor layer 100a may have a maximum value in a vertical distance to both the process surface 101a and a surface on the back, wherein the vertical direction is orthogonal to the process surface 101a.

The trench etch mask layer may include one single layer of a single material or two or more layers of different materials. For example, the trench etch mask layer may include at least a pad oxide layer, which may include a thermally grown semiconductor layer and/or deposited semiconductor oxide layers, e.g., thermal silicon oxide and/or deposited silicon oxide, as well as a silicon nitride layer. The trench etch mask layer may include further silicon oxide layers, a silicon oxynitride layer and/or a carbon layer.

From the trench etch mask layer, a photolithography process forms a trench etch mask 410 with first mask openings 411 exposing first portions of the semiconductor layer 100a and with second mask openings 412 exposing second portions of the semiconductor layer 100a. The first and second mask openings 411, 412 alternate along one horizontal direction parallel to the process surface 101a or along two orthogonal horizontal directions parallel to the process surface 101a.

By using the trench etch mask 410, first trenches 161 are formed in the vertical projection of the first mask openings 411 and second trenches are formed in the vertical projection of the second mask openings 412 in the semiconductor layer 100a. The first and second trenches 161, 162 may be formed contemporaneously or at different points in time. The trench etch may include reactive ion etching (RIE).

FIG. 1A shows the trench etch mask 410 on the process surface 101a of the semiconductor layer 100a, wherein first mask openings 411 and second mask openings 412 alternate along a first horizontal direction. The first and second mask openings 411, 412 may have the same shape and the same dimensions. According to an embodiment, the first and second mask openings 411, 412 have approximately equal widths along two orthogonal horizontal directions. According to other embodiments, a first horizontal extension of the first and second mask openings 411, 412 is at least twice, e.g., at least ten times a second horizontal dimension orthogonal to the first horizontal dimension.

The first and, if applicable, second trenches 161, 162 extend from the process surface 101a into the semiconductor layer 100a. The second trenches 162 are not necessarily formed at this stage as indicated by the dotted lines. Vertical extensions of the first and second trenches 161, 162 orthogonal to the process surface 101a may be equal. According to other embodiments, the first trenches 161 may have a greater vertical extension than the second trenches 162.

The first and second trenches 161, 162 may have approximately vertical sidewalls or may taper with increasing distance to the process surface 101a. According to a further embodiment, the sidewalls of the first and second trenches 161, 162 may be slightly bowed.

First semiconductor regions 171 of a first conductivity type are formed selectively in the first trenches 161, wherein a differentiator mask 420 hampers the formation of second trenches with further first semiconductor regions. The differentiator mask 420 may either effect that second trenches 162 have not been formed at a point in time when the first semiconductor regions 171 are formed or, if the second trenches 162 have already been formed at that point in time, prevents further first semiconductor regions from being formed in the second trenches 162.

The differentiator mask 420 may include a passivation liner mask that selectively lines the second trenches 162, passivation plugs selectively filling the second trenches 162, and/or a passivation layer mask that spans the second trenches 162 during formation of the first semiconductor regions 171 or that fills or covers the second mask openings 412 during formation of the first trenches 161.

FIG. 1B shows the first semiconductor regions 171 formed exclusively in the first trenches 161, while the second trenches 162 are either not formed at this point in time or protected against the formation of first semiconductor regions by a differentiator mask 420. The first semiconductor regions 171 may consist of or contain crystalline semiconductor material grown by epitaxy on surface portions of the semiconductor layer 100a exposed in the first trenches 161. According to another embodiment, the first semiconductor regions 171 may be based on re-crystallized deposited amorphous or polycrystalline semiconductor material.

Then the second trenches 162 are either formed or exposed by removing the differentiator mask 420 and second semiconductor regions 172 of a second conductivity type opposite to the first conductivity type are formed in the second trenches 162. Apart from the dopants and the conductivity type, the material of the second semiconductor regions 172 may be the same as the material of the first semiconductor regions 171.

The first and second semiconductor regions 171, 172 may be formed by selective epitaxy of in-situ doped semiconductor material, or by a sequence of providing dopants along the trench sidewalls, epitaxial growth of intrinsic or low-doped semiconductor material in the first and second trenches 161, 162, and diffusing the dopants provided along the trench sidewalls into the epitaxially grown intrinsic or low-doped semiconductor material. Providing the dopants along the trench sidewalls may include implanting dopants through the sidewalls, diffusing dopants from a gaseous or solid material containing the dopants through the trench sidewalls, PLAD (plasma doping), and/or deposition of a thin, heavily doped semiconductor layer by epitaxy.

Since both the first and the second semiconductor regions 171, 172 are formed by filling trenches, the degree of compensation can be finely and reliably adjusted. Since both the first and the second semiconductor regions 171, 172 are defined by the same trench etch mask 410, variations of the horizontal cross-sectional areas among the first and second semiconductor regions 171, 172 are drastically reduced compared to other trench approaches. Conformity of the degree of compensation is subjected to lower fluctuations both within the same device, among devices obtained from the same semiconductor substrate 500a and among devices obtained from different semiconductor substrates 500a.

Figure 2B:
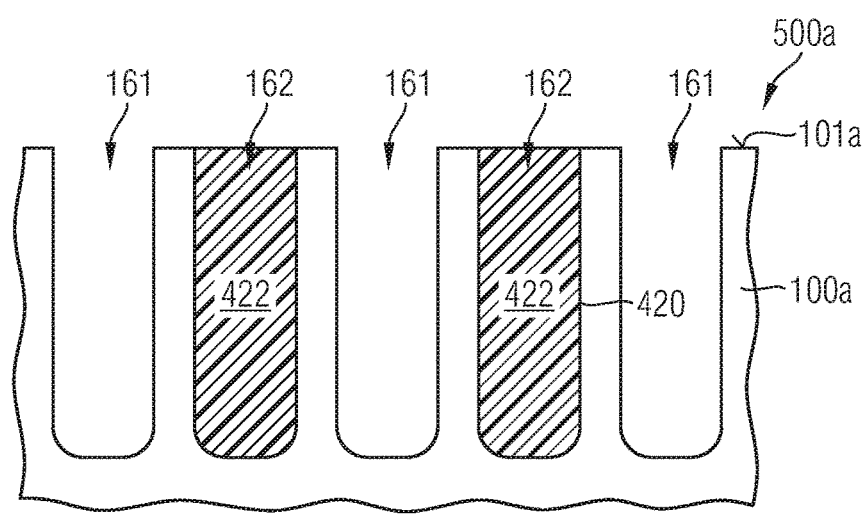
FIG. 2B is a schematic vertical cross-sectional view of a portion of a semiconductor substrate according to an embodiment using passivation plugs filling the second trenches as differentiator mask.
Figure 2C:
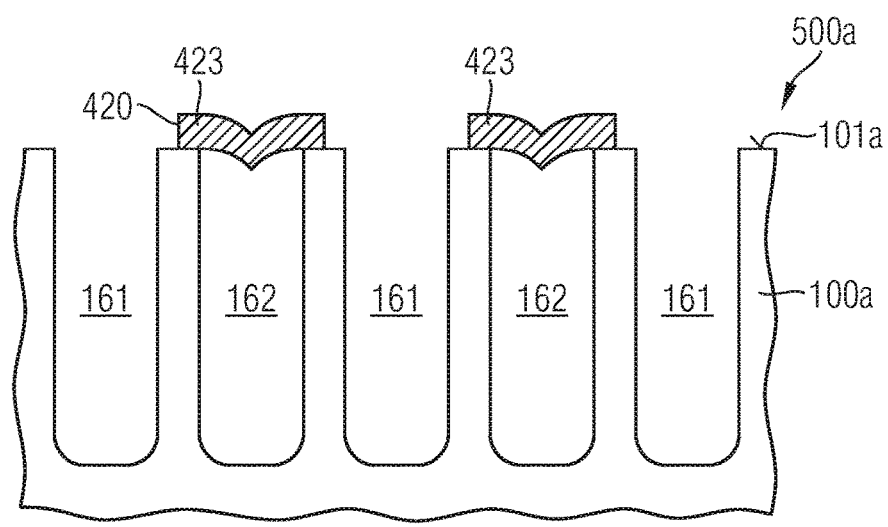
FIG. 2C is a schematic vertical cross-sectional view of a semiconductor substrate portion according to an embodiment using a passivation layer mask above the second trenches as differentiator mask.

FIGS. 2A to 2D refer to different embodiments of the differentiator mask 420 mentioned in FIG. 1B, wherein in the embodiments of FIGS. 2A to 2C the semiconductor substrate 500a may or may not include the trench etch mask 410 of FIG. 1B or remnants of the trench etch mask 410 in addition to the differentiator mask 420.

In FIG. 2A, the differentiator mask 420 includes a passivation liner mask 421 lining the second trenches 162 but absent in the first trenches 161. The passivation liner mask 421 may be a layer that suppresses epitaxial growth of semiconductor material on sidewalls and at the bottom of the second trenches 162. For example, the passivation liner mask 421 is a thermally grown semiconductor oxide layer, a deposited semiconductor oxide layer, a silicon oxynitride layer, a silicon nitride layer or a combination thereof. The passivation liner mask 421 may be formed either by avoiding formation of portions of a passivation liner in the first trenches 161 or by forming a passivation liner with first portions in the first trenches 161 and with second portions in the second trenches 162 and then selectively removing the first portions, for example by using an etch mask that covers the second portions and exposes the first portions of the passivation liner.

According to the embodiment of FIG. 2B the differentiator mask 420 includes passivation plugs 422 that are exclusively formed in the second trenches 162 and that are absent in the first trenches 161. For example, an auxiliary mask filling or bridging the first trenches 161 and exposing the second trenches 162 may suppress the formation of the passivation plugs 422 in the first trenches 161. According to another embodiment, first passivation plugs are formed in the first trenches 161 and second passivation plugs are formed in the second trenches 162 and an auxiliary mask covering the second passivation plugs and exposing the first passivation plugs allows for selectively removing the first passivation plugs.

FIG. 2C shows a passivation layer mask 423 exclusively covering openings of the second trenches 162 and exposing openings of the first trenches 161, wherein the passivation layer mask 423 forms the differentiator mask 420.

Figure 2D:
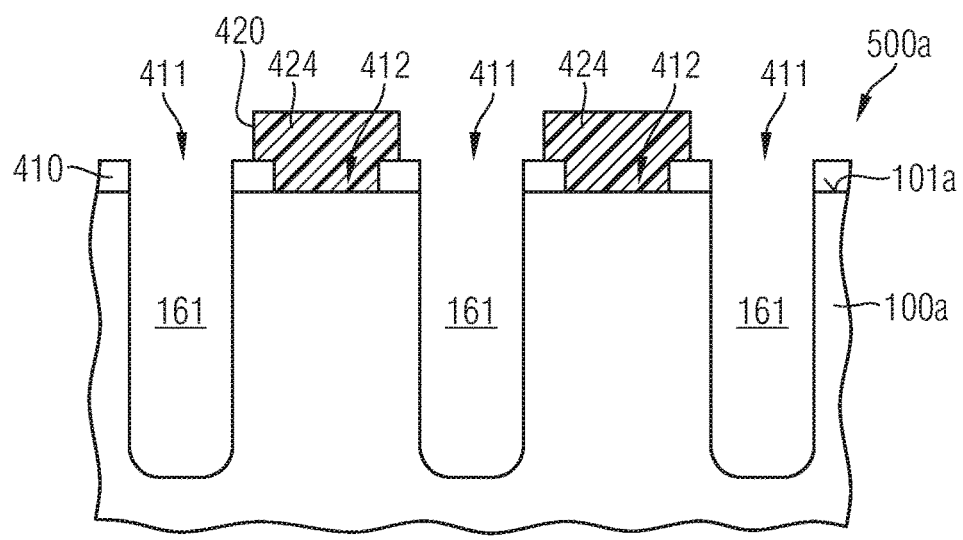
FIG. 2D is a schematic vertical cross-sectional view of a portion of a semiconductor substrate according to an embodiment using a passivation layer mask for a successive formation of the first and second trenches from the trench etch mask.

FIG. 2D refers to a successive formation of the first and second trenches 161, 162 by using a composed mask including the trench etch mask 410 and a passivation etch mask 424 that may be sandwiched between the trench etch mask 410 and the semiconductor layer 100a or that may be formed at a side of the trench etch mask 410 opposite to the semiconductor layer 100a, wherein the passivation etch mask 424 selectively exposes first mask openings 411 of the trench etch mask 410 in the vertical projection of the first trenches 161 and covers second mask openings 412 for the formation of the second trenches 162.

Using the composed mask, an etch process forms the first trenches 161 in the semiconductor layer 100a. Then the first semiconductor regions 171 are formed in the first trenches 161. After formation of the first trenches 161, the passivation etch mask 424 may be removed and after formation of the first semiconductor regions 171 the second trenches 162 are formed using the trench etch mask 410.

Though formed at different points in time, the first and second trenches 161, 162 are defined by the same trench etch mask 410 and therefore lateral dimension variations are reduced to the same degree as in the embodiments of FIG. 2A to 2C.

FIGS. 3A to 8B show details of a process of manufacturing a superjunction device by forming oppositely doped semiconductor regions in trenches resulting from the same trench etch mask.

A trench etch mask layer, which may be a single layer or a layer stack that may include two or more layers of different materials, e.g., a pad oxide layer 415, e.g., a silicon oxide layer, a silicon nitride layer 416, or a pad oxide layer 415, a silicon nitride layer 416 and a further layer of silicon oxide or doped or undoped silicate glass, is formed on a process surface 101a of a semiconductor layer 100a, which may be lightly n-doped. Then first and second mask openings 411, 412 are formed in the trench etch mask layer to form a trench etch mask 410. An etch process, for example RIF, etches first trenches 161 in the vertical projection of the first mask openings 411 and second trenches 162 in the vertical projection of the second mask openings 412 into the semiconductor layer 100a.

Figure 3A:
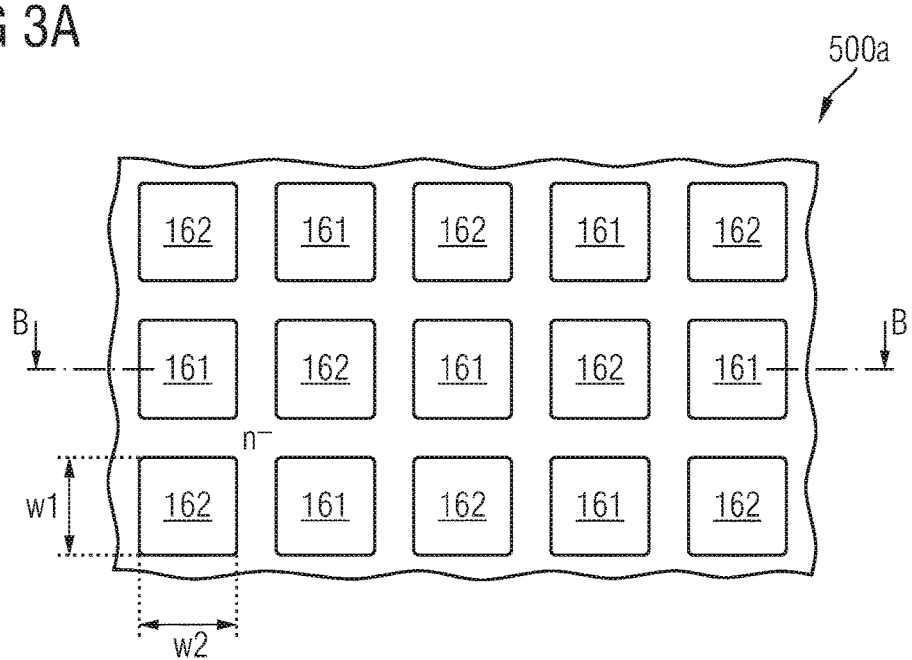
FIG. 3A is a schematic horizontal cross-sectional view of a portion of a semiconductor substrate during manufacture of a superjunction semiconductor device according to an embodiment using an auxiliary mask for forming a passivation liner mask, after forming first and second trenches.
Figure 3B:
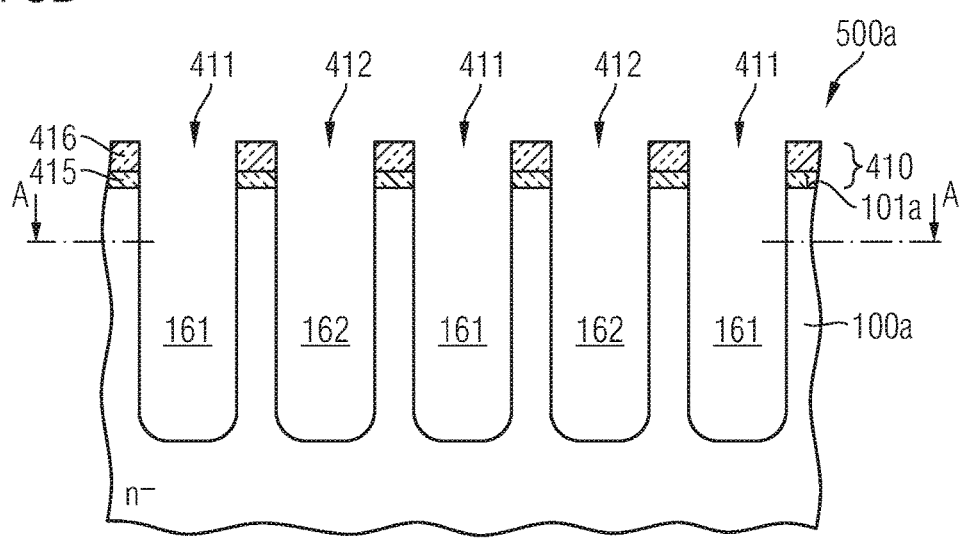
FIG. 3B is a schematic vertical cross-sectional view of the semiconductor substrate portion of FIG. 3A along line B-B.

FIGS. 3A and 3B show the trench etch mask 410 including the pad oxide layer 415 and the silicon nitride layer 416. Horizontal cross-sectional areas of the first and second trenches 161, 162 may have the same shape.

The horizontal dimensions of the first and second trenches 161, 162 may be equal throughout a device region of the semiconductor substrate 500a, wherein from each device region one single semiconductor device is formed. Within each device region, the horizontal dimensions of both the first and second trenches 161, 162 may decrease to the same degree with decreasing distance to edges of the respective device region. Alternatively, within each device region, the horizontal dimensions of one of the first and second trenches 161, 162 may decrease with respect to the other of the first and second trenches 161, 162 with decreasing distance to edges of the respective device region.

As illustrated in FIG. 3A, the first and second trenches 161, 162 may alternate along two orthogonal horizontal directions and may have the same lateral dimensions. A first horizontal width w1 of the first and second trenches 161, 162 may be equal to or approximately equal to a second horizontal width w2 orthogonal to the first horizontal width w1. The horizontal cross-sectional area may be a circle or a polygon with or without rounded or chamfered corners, for example a square, a hexagon or an octagon. According to other embodiments, the second horizontal width w2 is significantly greater than the first horizontal width w1. For example, the second horizontal width w2 exceeds at least five times the first horizontal width w1, wherein the horizontal cross-sectional areas of the first and second trenches 161, 162 may be short rectangular stripes with or without rounded or chamfered corners.

A passivation liner 429 may be formed, that may line the first and second trenches 161, 162. According to an embodiment, the passivation liner 429 is formed by a heating treatment in oxygen containing atmosphere. According to another embodiment, the passivation liner 429 is formed by deposition of a material that blocks epitaxial growth of semiconductor material on sidewalls of the first and second trenches 161, 162, for example, deposited silicon oxide such as silicon oxide formed by using TEOS (tetraethylorthosilicate) as precursor material. A first auxiliary mask layer may be deposited and patterned to form a first auxiliary mask 430 covering the openings of the second trenches 162. Mask openings 431 of the first auxiliary mask 430 expose the openings of the first trenches 161.

Figure 4A:
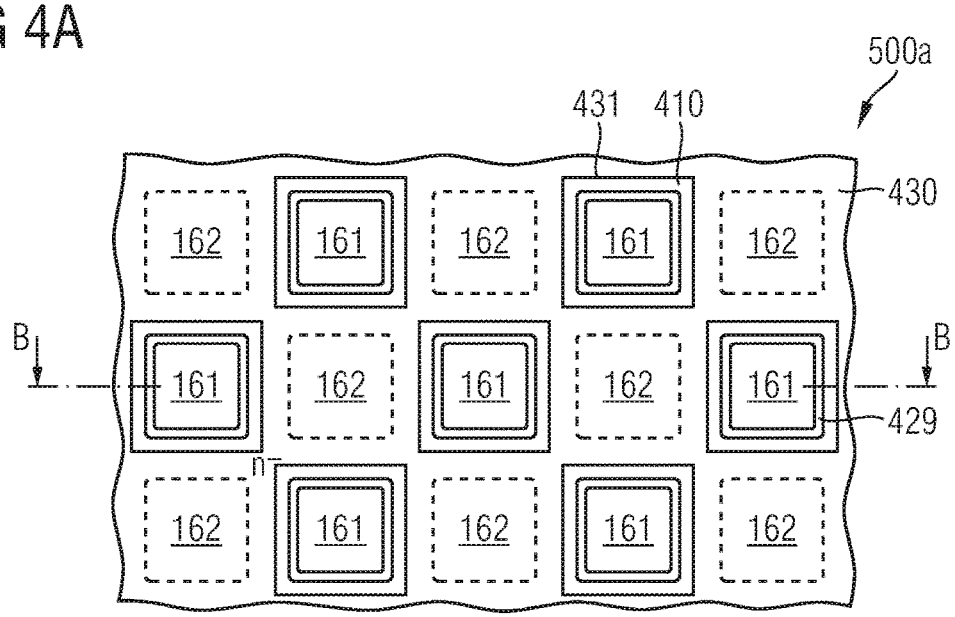
FIG. 4A is a schematic plan view of the semiconductor substrate portion of FIG. 3A after forming a passivation liner and a first auxiliary mask covering the second trenches.
Figure 4B:
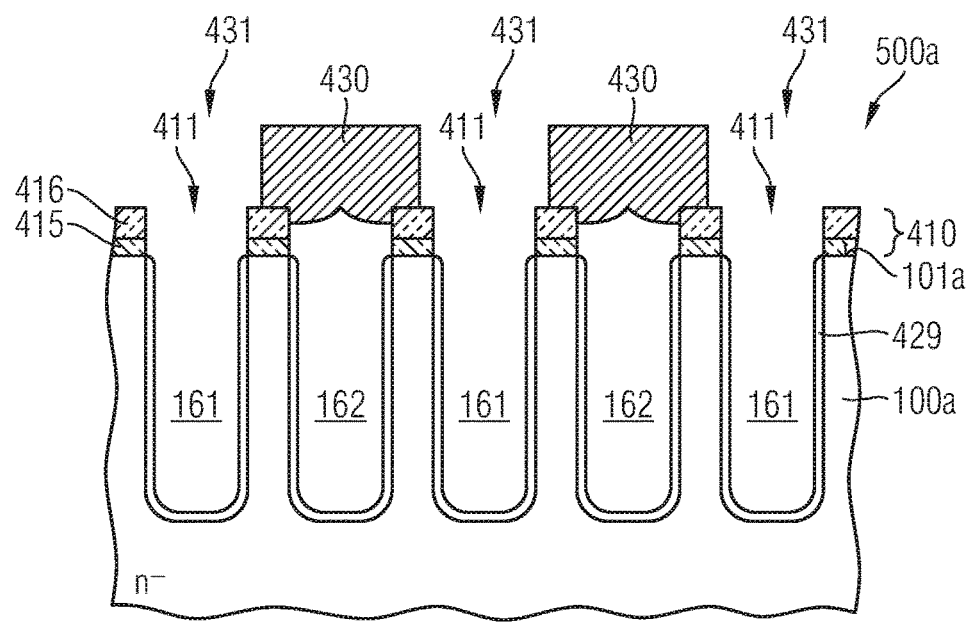
FIG. 4B is a schematic vertical cross-sectional view of the semiconductor substrate portion of FIG. 4A along line B-B.

FIGS. 4A and 4B show the first auxiliary mask 430 spanning across the second trenches 162. The material of the first auxiliary mask 430 may be any material capable of spanning or filling the second trenches 162, completely removable from above the first trenches 161 and showing high etch selectivity against the material of the passivation liner 429. For example, the material of the first auxiliary mask 430 is carbon and the passivation liner 429 is, e.g., of silicon oxide. Alternatively, the material of the first auxiliary mask 430 is a silicon oxide if the passivation liner 429 comprises, e.g., silicon nitride. Using the first auxiliary mask 430 as etch mask, first portions of the passivation liner 429 in the first trenches 161 are removed, whereas remnant second portions of the passivation liner 429 in the second trenches 162 form a passivation liner mask 421.

Figure 5A:
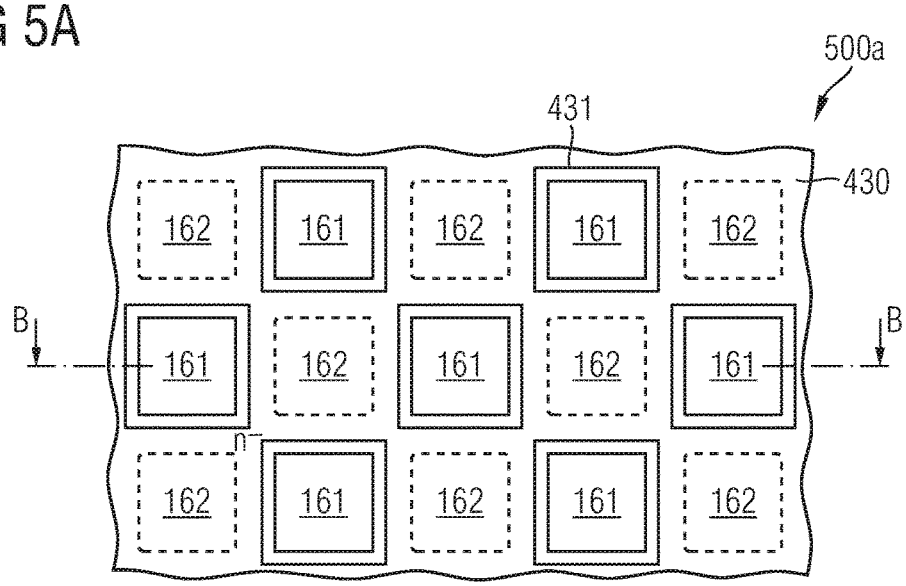
FIG. 5A is a schematic plan view of the semiconductor substrate portion of FIG. 4A after forming a passivation liner mask from the passivation liner.
Figure 5B:
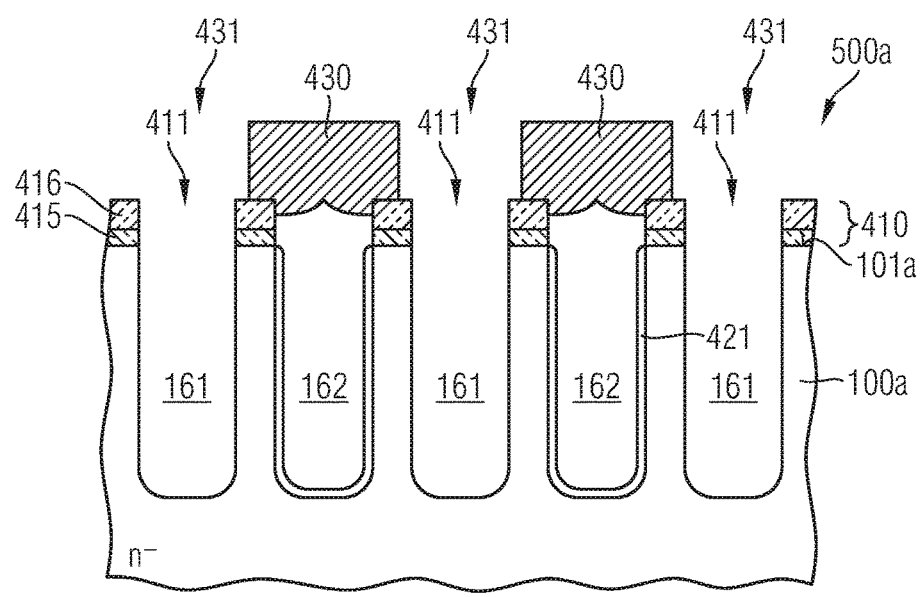
FIG. 5B is a schematic vertical cross-sectional view of the semiconductor substrate portion of FIG. 5A along line B-B.

FIGS. 5A to 5B show the passivation liner mask 421 lining the inner surface of the second trenches 162. Inner surfaces of the first trenches 161 are exposed.

The first auxiliary mask 430 may be removed and the first semiconductor regions 171, which may be n-type, are formed by selective epitaxy. During epitaxial growth, a silicon crystal grows in registry with the crystal lattice of the semiconductor layer 100a on exposed surfaces of the semiconductor layer 100a in the first trenches 161. In the second trenches 162 the passivation liner mask 421 inhibits any epitaxial growth.

Figure 6A:
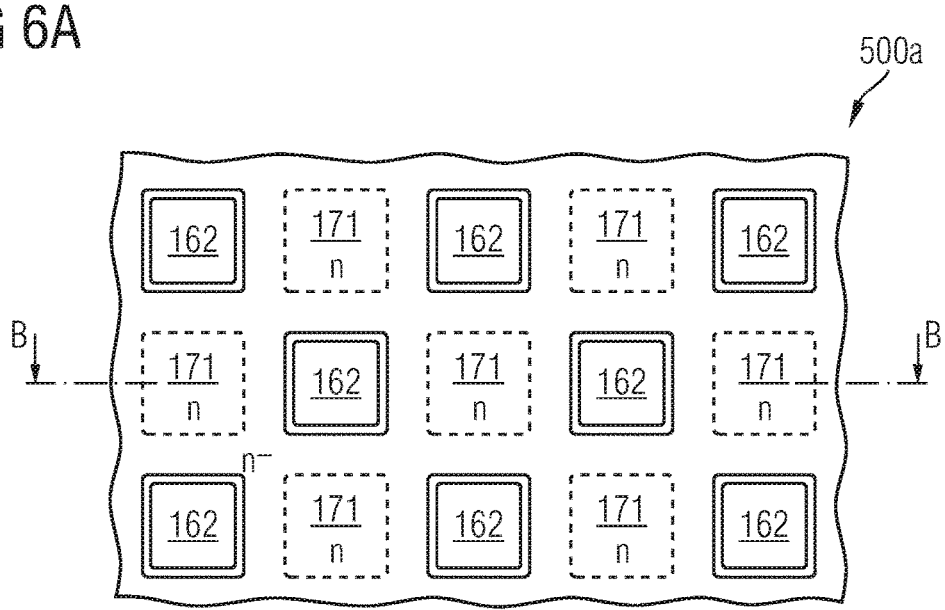
FIG. 6A is a schematic horizontal cross-sectional view of the semiconductor substrate portion of FIG. 5A, after forming first semiconductor regions in the first trenches.
Figure 6B:
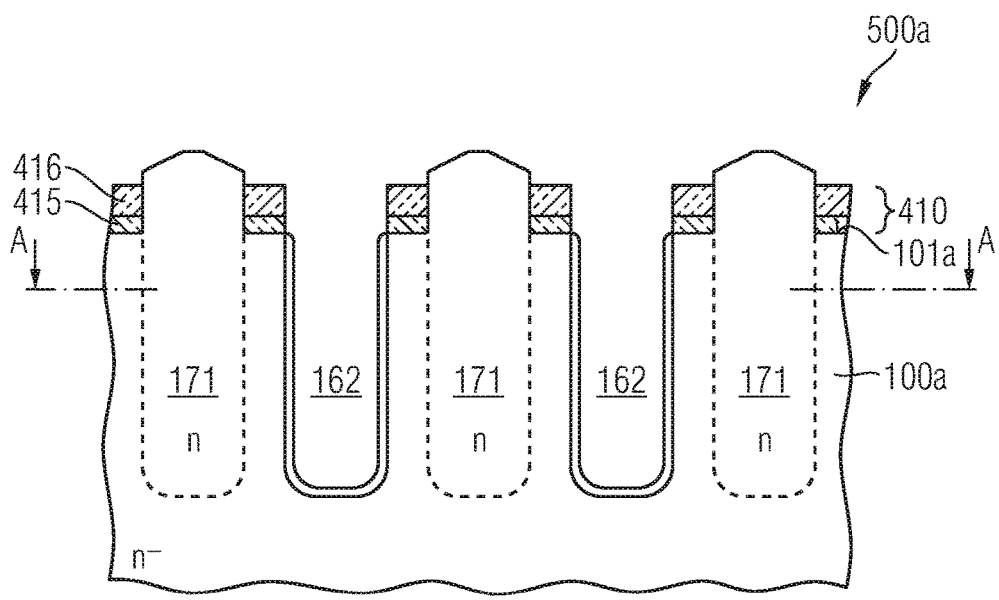
FIG. 6B is a schematic vertical cross-sectional view of the semiconductor substrate portion of FIG. 6A along line B-B.

FIGS. 6A and 6B show the first semiconductor regions 171 grown by selective epitaxy in the first trenches 161 as well as the passivation liner mask 421 blocking epitaxial growth in the second trenches 162. The first semiconductor regions 171 may grow to beyond an upper edge of the trench etch mask 410 and excess material may also laterally overgrow the trench etch mask 410 to some degree.

In the following, the passivation liner mask 421 is removed from the second trenches 162.

Figure 7A:
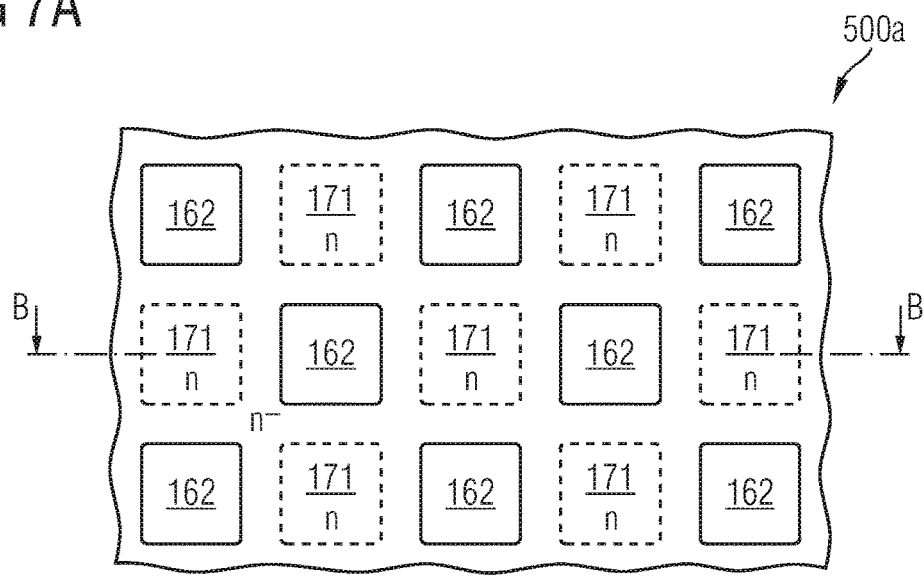
FIG. 7A is a schematic horizontal cross-sectional view of the semiconductor substrate portion of FIG. 6A, after forming a second auxiliary mask covering the first semiconductor regions.
Figure 7B:
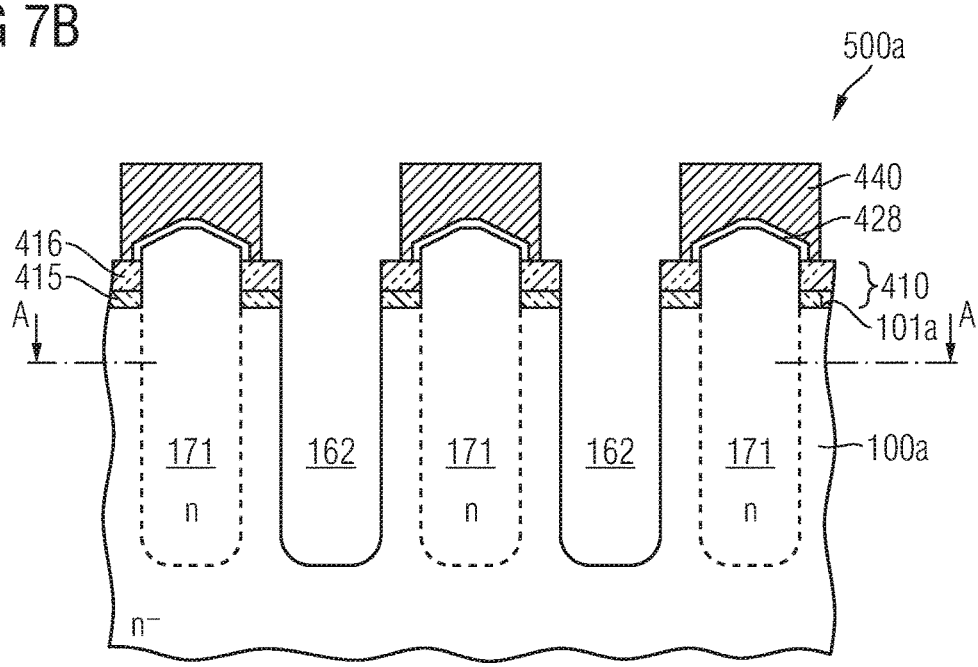
FIG. 7B is a schematic vertical cross-sectional view of the semiconductor substrate portion of FIG. 7A along line B-B.

According to the embodiment illustrated in FIGS. 7A and 7B, a further passivation layer 428 may be formed on exposed surfaces of the first semiconductor regions 171. The further passivation layer 428 may by a thermal oxide layer that hampers any further epitaxial growth on the first semiconductor regions 171. A second auxiliary mask layer may be deposited and patterned by photolithography to form a second auxiliary mask 440 exposing the second trenches 162 and covering the first semiconductor regions 171. Using the second auxiliary mask 440 as etch mask the passivation liner mask 421 may be removed and, after removal of the second auxiliary mask 440, second semiconductor regions 172 of p-type may be formed by epitaxial growth on surfaces of the semiconductor layer 100a exposed in the second trenches 162.

Epitaxial material grown above the trench etch mask 410 or above remnants of the trench etch mask 410 may be removed, for example by CFP (chemical-mechanical polishing) using the trench etch mask 410 or the remnants of the trench etch mask 410 as etch stop. Further, the epitaxial material in the first and second trenches 161, 162 may be slightly recessed.

FIGS. 8A and 8B show the recessed first and second semiconductor regions 171, 172 with an upper edge approximately flush with the process surface 101a.

The trench etch mask 410 is removed and further processes for forming FET (field effect transistor) cells may follow. The processes for forming the FET cells may include further epitaxial growth of a semiconductor layer in which source and body zones are formed.

Figure 9:
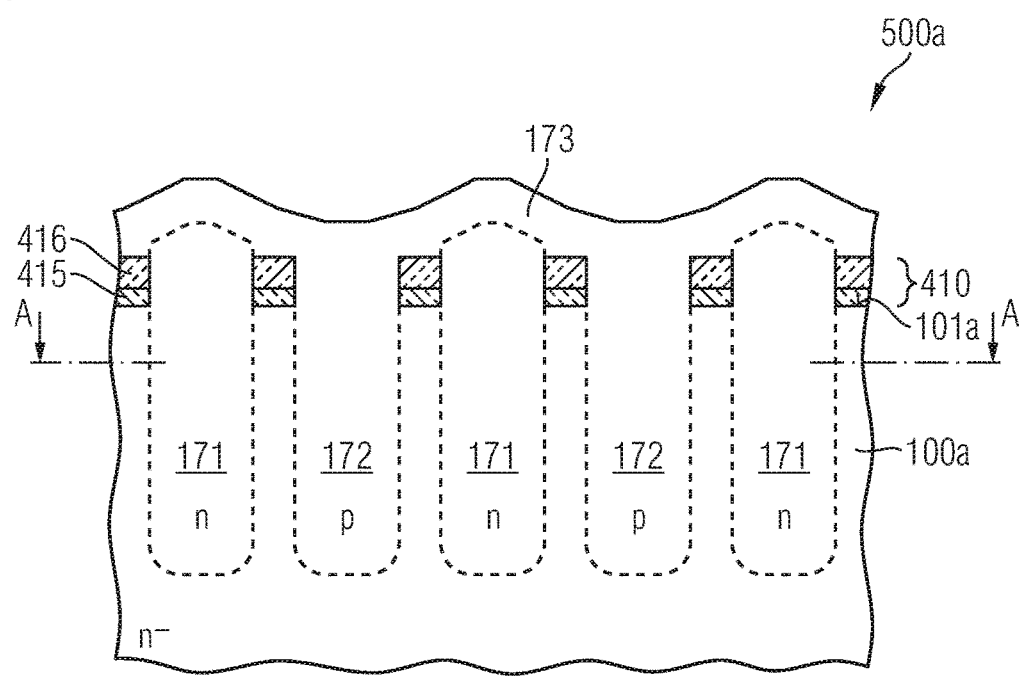
FIG. 9 is a schematic vertical cross-sectional view of a portion of a semiconductor substrate for illustrating a method of manufacturing a semiconductor device according to another embodiment, wherein the first and second semiconductor regions are formed without intermediate change of a process chamber.

FIG. 9 refers to an alternative process flow after formation of the first semiconductor regions 171 in the first trenches 161 as illustrated in FIGS. 6A and 6B.

The passivation liner mask 421 in the second trenches 162 is removed directly after epitaxial growth, e.g., in the process chamber that performs the epitaxial growth process for the first semiconductor regions 171. Directly after cracking the passivation liner mask 421 by a heating treatment in an atmosphere containing reducing agents, e.g., hydrogen $H_2$, fluoroform $CHF_3$, or a mixture of tetrafluoromethane $CF_4$ and hydrogen in the process chamber, the second semiconductor regions 172 are formed in the same process chamber. Both the first and the second semiconductor regions 171, 172 are formed successively in the same process chamber simply by changing the supplied dopants from n-type to p-type. Process-induced variations of dopant concentrations caused, e.g., by drifting parameters of the process chamber can be significantly reduced.

As shown in FIG. 9, in that case no further passivation layer is formed on the first semiconductor regions 171 and p-doped material forms the second semiconductor regions 172 in the second trenches 162. Excess p-type epitaxial material 173 grows on the surface of the first semiconductor regions 171. Processing may continue with a CMP or etch process as described with reference to FIGS. 8A and 8B.

According to other embodiments, the first semiconductor regions 171 may be p-type and the second semiconductor regions 172 may be n-type. The semiconductor layer 100a may be intrinsic, n-type or p-type. A dopant concentration in the semiconductor layer 100a may be uniform or may steadily or in steps decrease or increase with increasing distance to the process surface 101a. The semiconductor layer 100a may also include one or more pn junctions. According to an embodiment, the doping concentration of the semiconductor layer 100a is lower than the doping concentration of the first and second semiconductor regions 171, 172 by a factor of 2, for example, by a factor of 5.

Figure 10:
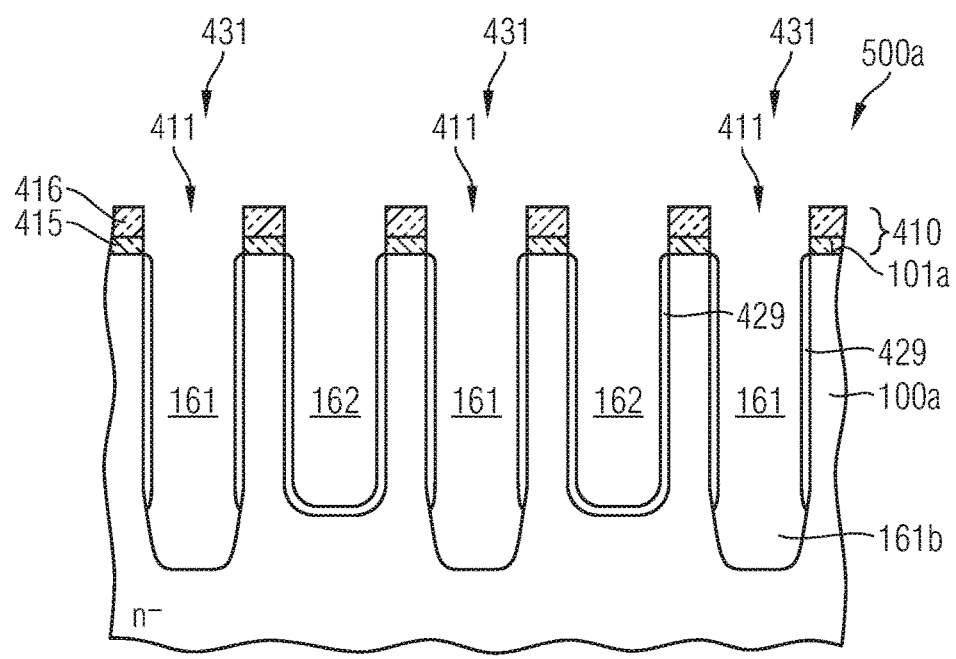
FIG. 10 is a schematic vertical cross-sectional view of a portion of a semiconductor substrate for illustrating a method of manufacturing a semiconductor device according to an embodiment including recessing the first trenches with respect to the second trenches.

FIG. 10 refers to an additional recess of either the first or the second trenches 161, 162 with respect to the other of the first and second trenches 161, 162. For example, the second trenches 162 may be covered by a first auxiliary mask 430 with mask openings 431 selectively exposing the first trenches 161 as shown in FIGS. 5A to 5B. Using the first auxiliary mask 430, portions of the passivation liner 429 may be removed from the first trenches 161 as illustrated in FIGS. 5A and 5B. The first auxiliary mask 430 may be removed and, before forming the first semiconductor regions 171, the first trenches 161 may be further recessed with respect to the second trenches 162.

Since the recess process may at the same time build up a passivation layer along the sidewalls of the first trenches 161, forming the recessed first trenches 161 may get along without any additional process step apart from the recess and may directly follow the process described with reference to FIGS. 5A and 5B.

According to another embodiment, the portions of the first passivation liner 429 in the first trenches 161 may be anisotropically etched such that the first passivation liner 429 is opened at the bottom of the first trenches 161 and remnant portions of the first passivation liner 429 on sidewalls of the first trenches 161 form a spacer mask. According to a further embodiment, a temporary spacer mask with a width greater than the layer thickness of the passivation liner 429 may be formed by conformal deposition and anisotropic etch of the spacer material such that a spacer opening only exposes central regions at the bottom of the first trenches 161.

FIG. 10 shows the first trenches 161 with trench extensions 161b formed after an anisotropic etch of the passivation liner 429 in the first trenches 161.

Figure 11A:
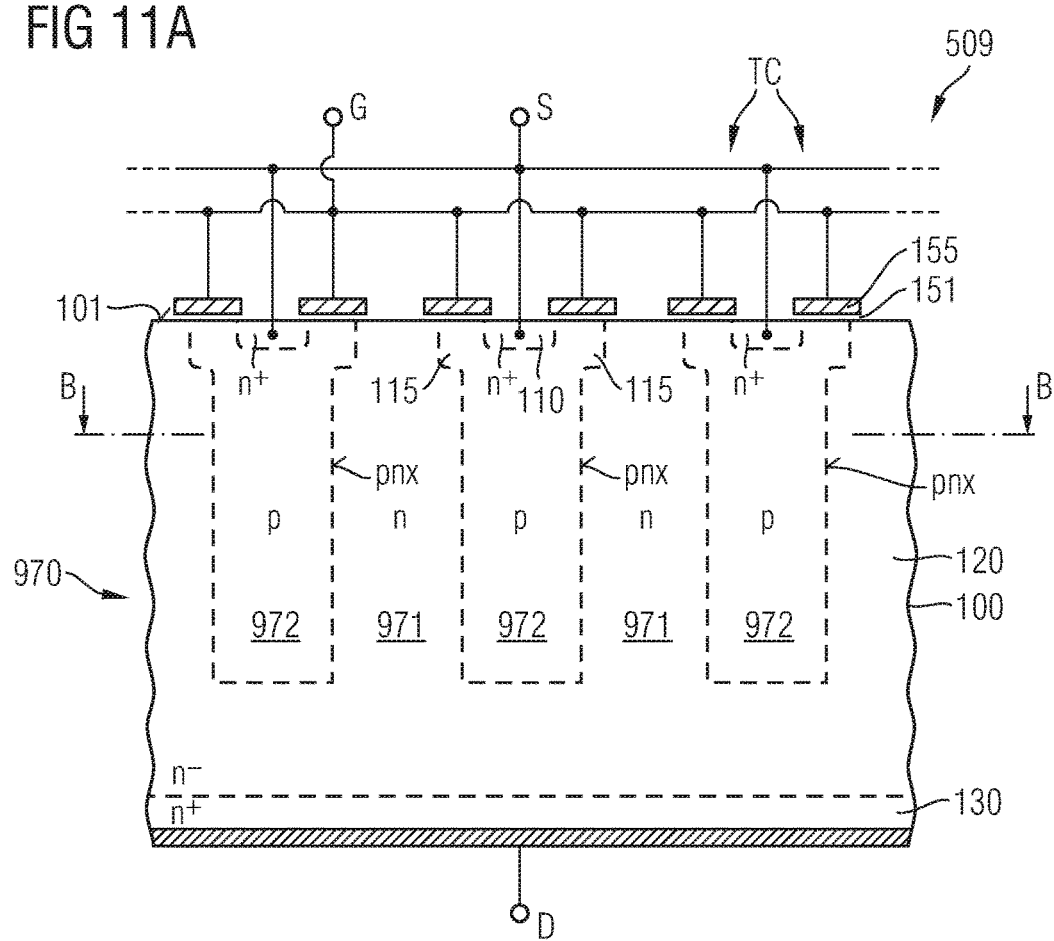
FIG. 11A is a schematic cross-sectional view of a drift layer with a reference super junction structure for discussing effects of the embodiments.
Figure 11B:
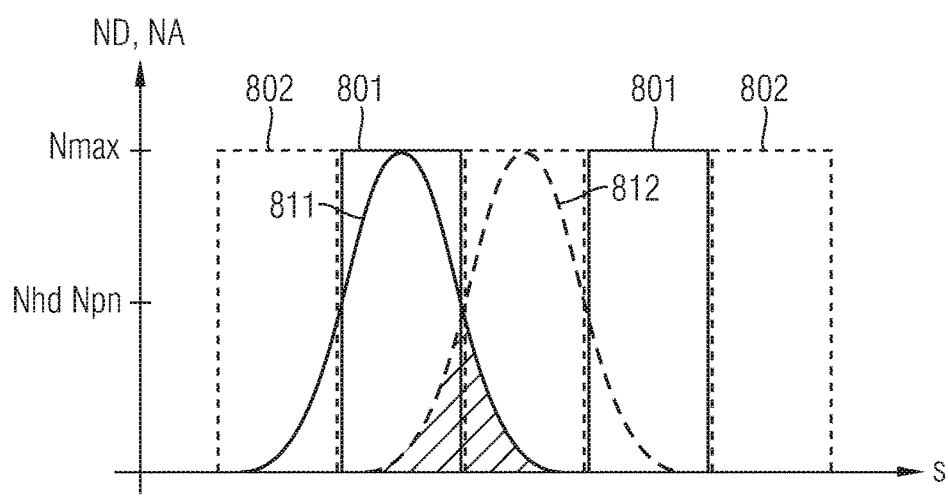
FIG. 11B is a diagram schematically illustrating normalized dopant profiles along line B-B of FIG. 11A before and after heating treatments.

FIGS. 11A and 11B refer to a reference example of a reference superjunction structure 970 formed in a drift layer 120 of a semiconductor layer 100a of a reference device 509, which may be an IGFET (insulated gate field effect transistor) with gate electrodes 155 capacitively coupled to channel portions of p-type body zones 115 through gate dielectrics 151. A potential applied to a gate terminal G, which is electrically connected to the gate electrodes 155, controls formation of inversion channels connecting n-type source zones 110 with the n-type first semiconductor regions 171 and thereby controls a load current flow between a source terminal S and a drain terminal D through the semiconductor portion 100 in the vertical direction.

In the reference device 509, first semiconductor regions 971 of the reference superjunction structure 970 are formed from portions of a uniformly doped n-type drift layer 120 and second semiconductor regions 972 are formed by uniformly filling trenches etched into the drift layer 120 with p-type semiconductor material. The first and second semiconductor regions 971, 972 alternate along a horizontal direction and form pn junctions pnx.

Directly after filling the p-type material in the trenches a dopant profile may include approximately rectangular p-type profiles 802 from the uniform trench fill and rectangular n-type profiles 801 resulting from the remnant sections of the uniformly doped drift layer 120, wherein the p-type profiles 802 and the n-type profiles 801 directly adjoin to each other. A maximum dopant concentration Nmax for first and second semiconductor regions 971, 972 may be approximately equal in case the volumes of the first and second semiconductor regions are approximately equal.

Following processes may apply a thermal budget beyond a critical temperature at and beyond which the dopants diffuse to a significant degree such that in the finalized reference device 509 the original dopant profiles 801, 802 of FIG. 11A spread and interdiffusion takes place, wherein p-type dopants diffuse from the p-type second semiconductor regions 972 into the n-type first semiconductor regions 971 and vice versa as indicated by profiles 811, 812. Since the original dopant profiles 801, 802 directly adjoin to each other, the dopant concentrations for donors and acceptors Npn at the pn junctions pnx as well as the dopant concentrations Nhd at half a distance between center axes of neighboring first and second semiconductor regions 171, 172 are comparatively high. The interdiffused dopants reduce the effective net dopant concentration in the shaded area, adversely affect charge carrier mobility and, as a consequence, increase on-state resistance.

Figure 12A:
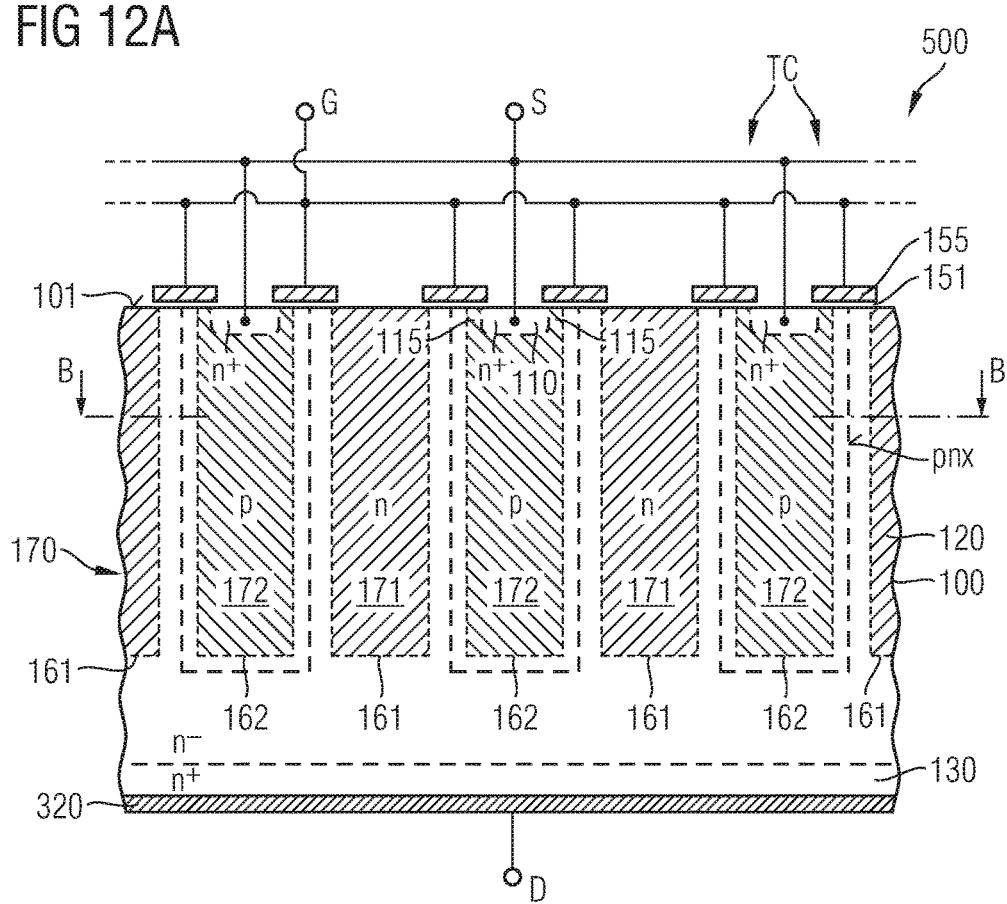
FIG. 12A is a schematic vertical cross-sectional view of a drift layer of a superjunction semiconductor device according to the embodiments for discussing effects of the embodiments.
Figure 12B:
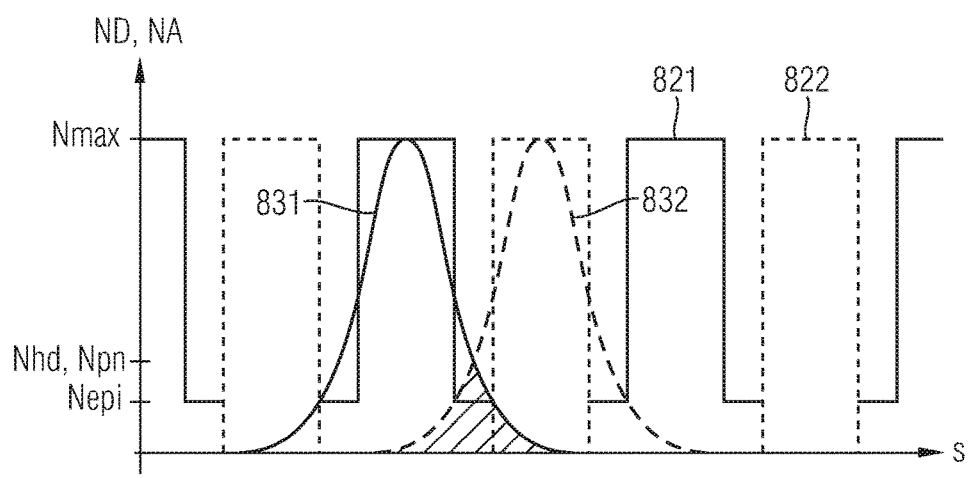
FIG. 12B is a diagram schematically illustrating normalized dopant profiles along line B-B of FIG. 12A according to an embodiment based on narrowly spaced trenches.

FIGS. 12A to 12C refer to a semiconductor device 500 which superjunction structure 170 results from a process described with reference to the preceding FIGs. Both the n-type first semiconductor regions 171 and the p-type second semiconductor regions 172 are formed by filling trenches 161, 162 etched into the drift layer 120 in a distance to each other. Consequently, surfaces that connect points of equal dopant concentration in the first and second semiconductor regions 171, 172 are not undulated as it is the case for semiconductor regions 171, 172 resulting from implants performed at different stages of a multi-epitaxy process.

Directly after filling the trenches 161, 162 with p-type and n-type semiconductor material, the resulting dopant profiles 821, 822 include spatially separated rectangles and a low background dopant concentration Nepi in the remnant portions of the drift layer 120 between neighboring first and second semiconductor regions 171, 172.

Applying the same thermal budget as for the reference example of FIGS. 11A to 11B results in that dopants diffuse out from the first and second semiconductor regions 171, 172, wherein at first they diffuse into the intermediate portions formed by remnants of the original drift layer 120. Due to the distance between neighboring first and second semiconductor regions 171, 172 the effective interdiffusion is significantly reduced.

In case the drift layer 120 does not comprise further pn junctions, the dopant concentration Npn at the vertical pn junction pnx between directly adjoining first and second semiconductor regions 171, 172 is at most 30% of the maximum. dopant concentration Nmax in the first semiconductor regions 171. According to an embodiment the dopant concentration Npn at the vertical pn junction pnx is at most 15%, e.g., at most 5% of the maximum dopant concentration Nmax in the first semiconductor regions 171.

The vertical pn junctions pnx may be at half a distance between vertical center axes of neighboring first and second semiconductor regions 171, 172. Vertical center axes are axes of symmetry or orthogonal vertical cross-sections of planes of symmetry of the first or the second semiconductor regions.

In case the horizontal dimensions of trenches from which the first and second semiconductor regions 171, 172 are formed deviate from each other by not more than about 20%, the dopant concentration Nhd at half a distance between vertical center axes of neighboring first and second semiconductor regions 171, 172 is at most 30% of the maximum dopant concentration Nmax in the first semiconductor regions 171. According to an embodiment the dopant concentration Nhd at half the distance between vertical center axes neighboring first and second semiconductor regions 171, 172 is at most 15%, e.g., at most 5% of the maximum dopant concentration Nmax in the first semiconductor regions 171.

A greater portion of the dopants is effective and charge carrier mobility is affected to a significantly lower degree. The distance between the first and second semiconductor regions 171, 172 before applying a thermal budget, i.e. the distance between the trenches from which the first and second semiconductor regions 171, 172 are formed as well as the background dopant concentration give a further degree of freedom for adjusting device parameters.

FIG. 12C shows the dopant profiles normalized to the maximum value in case the distance between the trenches from which the first and second semiconductor regions 171, 172 is sufficiently wide such that the applied thermal budget results in no or insignificant interdiffusion. In this case, the dopant concentration Nhd at half a distance between vertical center axes of neighboring first and second semiconductor regions 171, 172 is equal to the background dopant concentration Nepi.

Figure 13:
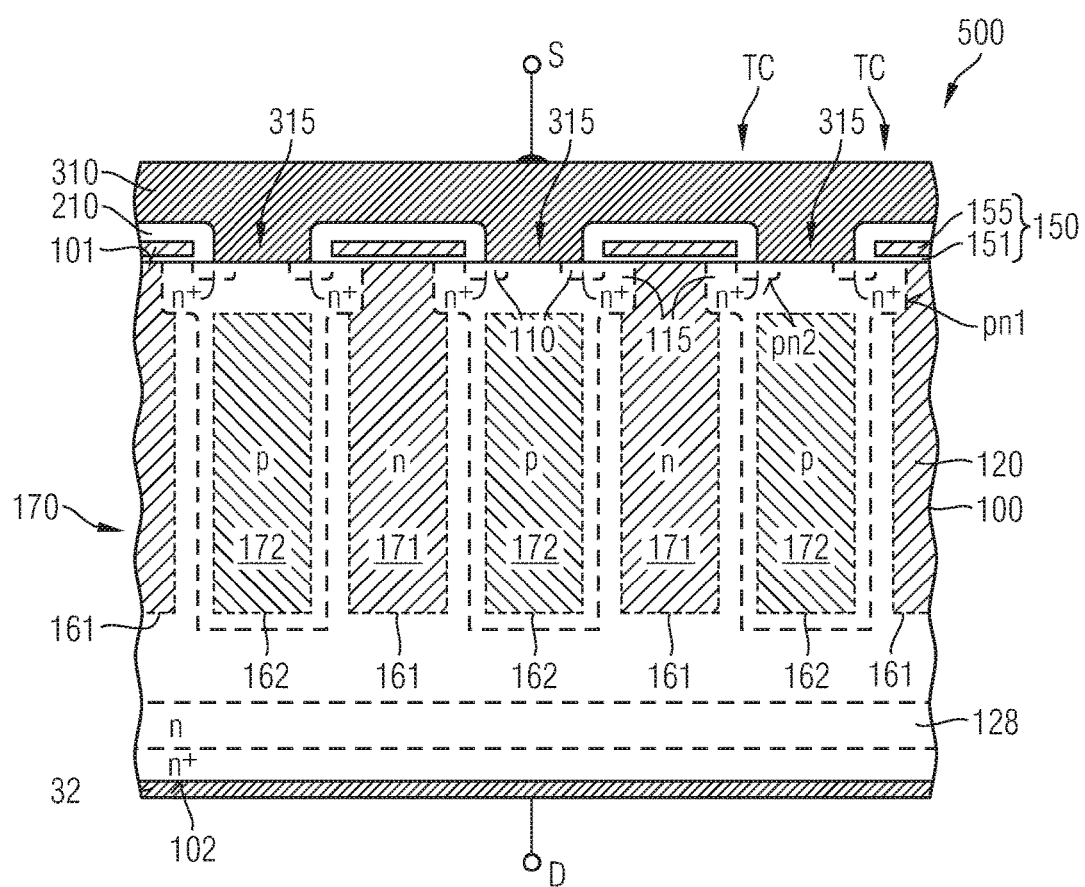
FIG. 13 is a schematic vertical cross-sectional view of superjunction semiconductor device with planar FET cells according to a further embodiment.

FIG. 13 shows a superjunction semiconductor device 500 including a plurality of identical FET cells TC. The semiconductor device 500 may be or may include an IGFET, for example an MOSFET (metal oxide semiconductor FET) in the usual meaning including FETs with metal gates as well as FETs with non-metal gates, by way of example. The semiconductor device 500 is based on a semiconductor portion 100 from a single-crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor portion 100 has a first surface 101 which may be approximately planar or which may be given by a plane spanned by coplanar surface sections as well as a mainly planar second surface 102 parallel to the first surface 101. A minimum distance between the first and second surfaces 101, 102 is selected to achieve a specified voltage blocking capability of the semiconductor device 500. A lateral surface 103 connects the first and second surfaces 101, 102.

In a plane perpendicular to the cross-sectional plane the semiconductor portion 100 may have a rectangular shape with an edge length in the range of several millimeters or may be disc-shaped with a diameter of several centimeters. A normal to the first surface 101 defines a vertical direction and directions orthogonal to the vertical direction are horizontal directions.

The semiconductor portion 100 includes a drift layer 120 of a first conductivity type as well as a drain layer 130 of the first conductivity type between the drift layer 120 and the second surface 102.

A dopant concentration in the drift layer 120 may gradually or in steps increase or decrease with increasing distance to the first surface 101 at least in portions of its vertical extension and/or may include one or more pn-junctions. According to other embodiments the dopant concentration in the drift layer 120 may be approximately uniform. A mean dopant concentration in the drift layer 120 may be between 5E12 cm$^{-3}$ and 1E15 cm$^{-3}$, for example in a range from 5E13 cm$^{-3}$ to 5E14 cm$^{-3}$.

According to an embodiment, a field stop layer 128 of the conductivity type of the drift layer 120 may separate the drift layer 120 from the drain layer 130. A mean impurity concentration in the field stop layer 128 may be at least 20% of the mean impurity concentration in the n-type first semiconductor regions 171 and at most one-fifth of a maximum impurity concentration in the drain layer 130.

A dopant concentration in the drain layer 130 along the second surface 102 is sufficiently high to form an ohmic contact with a metal directly adjoining the second surface 102. In case the semiconductor portion 100 is based on silicon Si, along the second surface 102 a dopant concentration in an n-type drain layer 130 may be at least 1E18 cm$^{-3}$, for example at least 5E19 cm$^{-3}$ and in a p-type drain layer 130 at least 1E16 cm$^{-3}$, for example at least 5E17 cm$^{-3}$.

The drift layer 120 includes a superjunction structure 170 effective as compensation structure and including first semiconductor regions 171 of the first conductivity type and second semiconductor regions 172 of the second conductivity type. The first and second semiconductor regions 171, 172 may be formed by depositing material containing n-type dopants and p-type dopants into trenches 161, 162 temporarily formed in the drift layer 120 and partially outdiffusing into remnant portions of the original drift layer 120.

The first and second semiconductor regions 171, 172 alternate along at least one horizontal direction. Surfaces that connect points of equal dopant concentration in the first and second semiconductor regions 171, 172 are not undulated and are parallel to the contour of the trenches 161, 162. The surfaces that connect points of equal dopant concentration do not show concave portions or notches as surfaces do that connect points of equal dopant concentration in the semiconductor regions of super junction structures resulting from a multi-epitaxial/multi-implant process.

The dopant concentrations in the first and second semiconductor regions 171, 172 may be adjusted to each other such that a portion of the drift layer 120 including the superjunction structure 170 can be completely depleted in a blocking state of the semiconductor device 500.

FET cells TC are formed in a portion of the semiconductor portion 100 along the first surface 101. The FET cells TC may be transistor cells with planar gate electrodes or trench gate electrodes. Each FET cell TC includes a portion of a body zone 115 of the second conductivity type forming first pn junctions pn1 with the n-type semiconductor regions 171 as well as source zones 110 forming second pn junctions pn2 with the body zones 115. The body zones 115 may be wells extending from the first surface 101 into the semiconductor portion 100. The source zones 110 may be wells extending from the first surface 101 into the body zones 115.

A gate structure 150 includes a conductive gate electrode 155 which may include or consist of a heavily doped polycrystalline silicon layer or a metal-containing layer. The gate structure 150 further includes a gate dielectric 151 separating the gate electrode 155 from the semiconductor portion 100, wherein the gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof. According to the illustrated embodiment the gate structure 150 is a lateral gate formed outside the semiconductor portion 100 along the first surface 101. According to another embodiment the gate structure 150 is a trench gate extending from the first surface 101 into the semiconductor portion 100.

In the illustrated embodiments and for the following description, the first conductivity type is n-type and the second conductivity type is p-type. Similar considerations as outlined below apply to embodiments with the first conductivity type being p-type and the second conductivity type being n-type.

When a voltage applied to the gate electrode 155 exceeds a preset threshold voltage, electrons accumulate in the channel portions of the body zones 115 directly adjoining the gate dielectric 151 and form inversion channels making the first and second pn junctions pn1 and pn2 transparent for electrons.

An interlayer dielectric 210 may insulate the gate electrodes 155 from a first load electrode 310. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

Contact structures 315 extending through openings in the interlayer dielectric 210 may electrically connect the first load electrode 310 with the body zones 115 and the source zones 110, wherein the contact structures 315 may extend through the source zones 110 into the semiconductor portion 100 to contact the body zones 115 via a highly doped contact region. The first load electrode 310 may be or may be electrically coupled or connected to a first load terminal, for example to the source terminal S of an n-IGFET.

A second load electrode 320, which directly adjoins the second surface 102 and the drain layer 130, may form or may be electrically connected to a second load terminal, which may be the drain terminal D of an n-IGFET.

Each of the first and second load electrodes 310, 320 may consist of or contain, as main constituent (s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, N, and Pd as main constituent(s), e.g., a silicide, a nitride and/or an alloy.

Figure 14A:
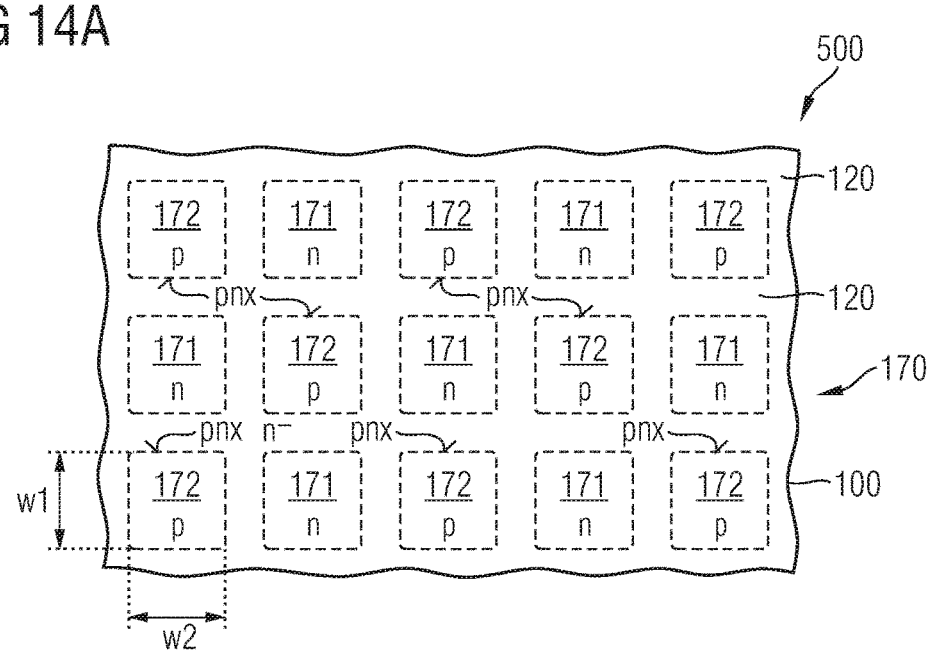
FIG. 14A is a schematic horizontal cross-sectional view of a superjunction semiconductor device according to an embodiment with dot-shaped first and second semiconductor regions.
Figure 14B:
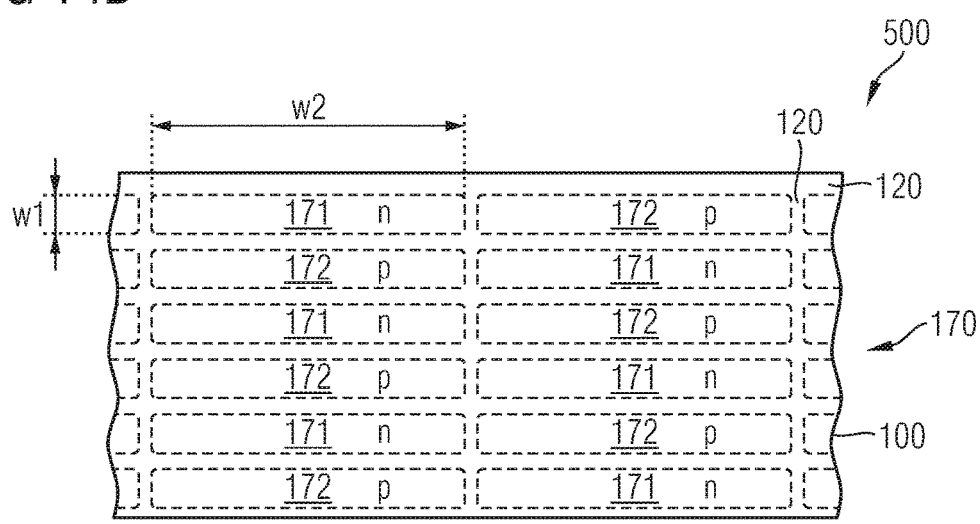
FIG. 14B is a schematic horizontal cross-sectional view of a superjunction semiconductor device according to an embodiment with semiconductor regions forming short stripes.

FIGS. 14A and 14B schematically show horizontal cross-sectional views through superjunction structures 170 of semiconductor devices 500, wherein the first and second semiconductor regions 171 and 172 remain separated from each other. According to other embodiment, the first and second semiconductor regions 171, 172 directly adjoin to each other.

In FIG. 14A, the first and second semiconductor regions 171, 172 are dot-shaped, wherein a first horizontal dimension w1 is approximately equal to a second horizontal dimension w2 orthogonal to the first horizontal dimension w1. The cross-sectional areas of the first semiconductor regions 171, the second semiconductor regions 172 or of both may be circles or regular polygons with or without rounded or chamfered corners such as squares, regular hexagons, or regular octagons, by way of example.

The first and second semiconductor regions 171, 172 strictly alternate along both horizontal directions. A center-to-center distance between neighboring first and second semiconductor regions 171, 172 may be in a range from 250 nm to 10 μm, for example in a range from 500 nm to 3 μm.

In FIG. 14B the second horizontal dimension w2 is at least twice, for example 10 times the first horizontal direction w1. During manufacture, fin-like remnants of the original drift layer 120 between trenches for the formation of the first and second semiconductor regions 171, 172 may form a stable mesh such that the risk that the fin-like remnants collapse during or after the trench etch is reduced.

In this case the horizontal cross-sectional areas of the first and second semiconductor regions 171, 172 may be short stripes with rounded or chamfered corners.

FIG. 15A shows a portion of an edge region 690 of a superjunction semiconductor device 500, wherein the edge region 690 surrounds a transistor cell region 610 and directly adjoins to a lateral surface (edge) 103 of the semiconductor portion 100. The transistor cell region 610 includes the active transistor cells TC through which a load current flows in an on-state of the semiconductor device 500. The edge region 690 is devoid of active transistor cells TC.

With decreasing distance to the lateral surface 103, the horizontal integral of the dopant concentration per pitch (center-to-center distance) between neighboring first and second semiconductor regions 171a, 172a in the edge region 690 may gradually or in steps change to the same degree because of a corresponding gradual or stepwise change of the cross-sectional areas of the trenches from which both the first and the second semiconductor regions 171a, 172a in the edge region 690 are formed. After diffusion of the dopants, neighboring first and second semiconductor regions 171a, 172a in the edge region 690 may directly adjoin to each other or may remain separated from each other by portions of the original drift layer.

The change of the dopant concentration per unit area may include a local decrease with decreasing distance to the lateral surface 103, a local increase, or both. For example, a steadily decreasing dopant concentration per unit area steadily reduces the lateral electric field component, and may gradually increase the local blocking capability with decreasing distance to the lateral surface 103.

According to the embodiment of FIG. 15B a variation of the horizontal cross-sectional area of the trenches for the first semiconductor regions 171a with reference to the trenches for the formation of the second semiconductor regions 172a in the edge region 690 may result in a variation of the degree of compensation with decreasing distance to the lateral surface 103. The variation of the degree of compensation gives an additional degree of freedom for designing a termination structure between the transistor cell region 610 and the lateral surface 103.

Figure 15C:
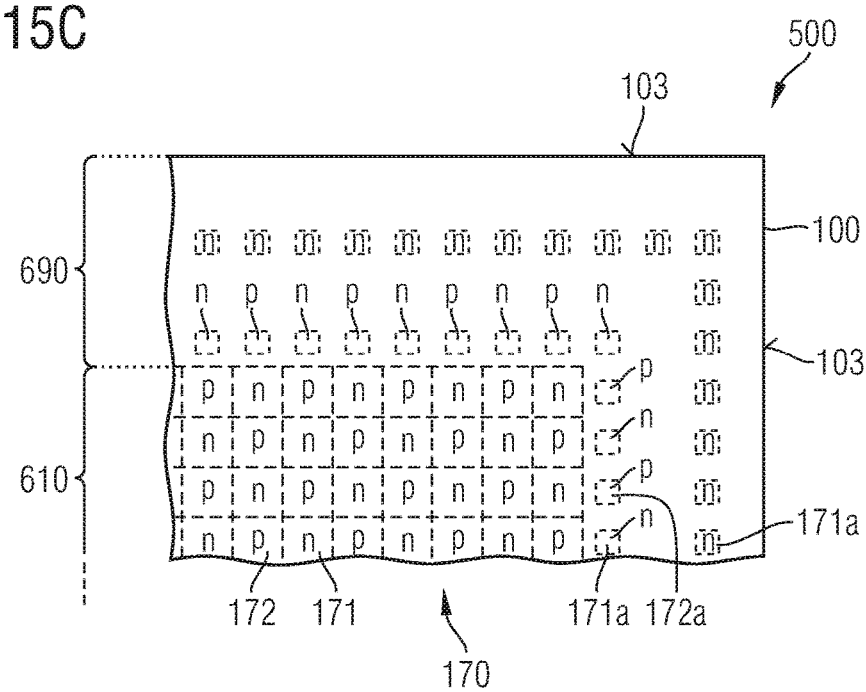
FIG. 15C is a schematic horizontal cross-sectional view of a portion of a semiconductor device according to an embodiment with first semiconductor regions forming a circumferential structure in an edge region.

In FIG. 15C the edge region 690 includes a circumferential structure formed by a plurality of first semiconductor regions 171a in the edge region 690, wherein the first semiconductor regions 171a in the edge region 690 are formed along lines. After diffusion from the fill material of the trenches, the first semiconductor regions 171a in the edge region 690 may form a continuous frame or may remain separated from each other. The circumferential structure may be effective as field stop.

The variation of the dopant concentration per unit area in the first and second semiconductor regions 171, 172 may be exclusively in the edge region 690, in both the edge region 690 and the transistor cell region 610, or exclusively in the transistor cell region 610.

Figure 15D:
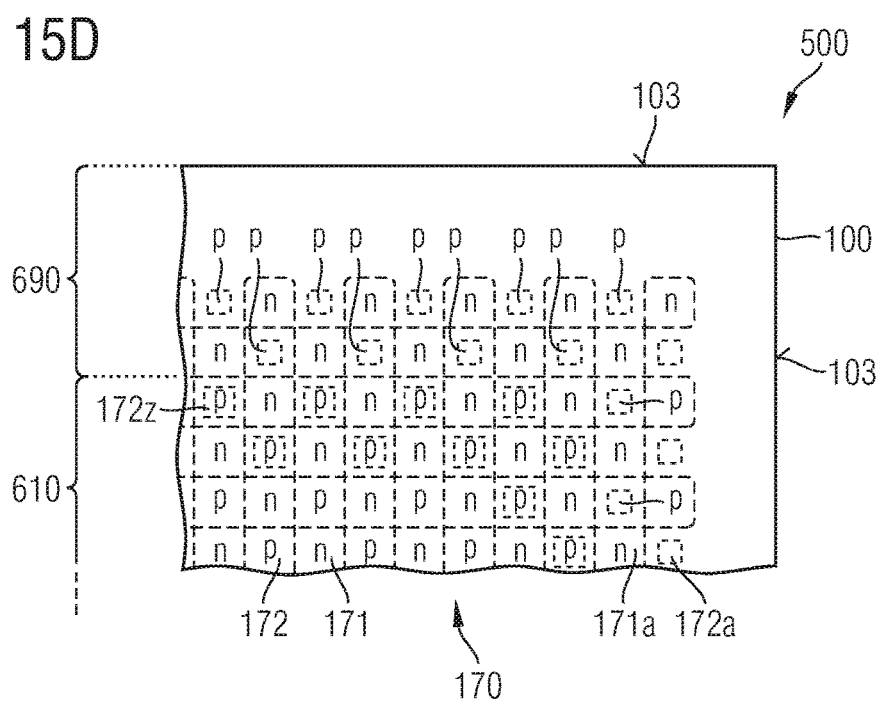
FIG. 15D is a schematic horizontal cross-sectional view of a portion of a semiconductor device according to an embodiment with the horizontal cross-sectional areas of trenches for one of the first and second semiconductor regions locally decreased with respect to the cross-sectional areas of trenches for the other of the first and second semiconductor regions within a transistor cell region.

For example, in FIG. 15D selected ones 172z of the second semiconductor regions 172 in the transistor cell region 610 may show a reduced dopant concentration per unit area to locally modulate the capacitance of the semiconductor device 500.

Figure 16:
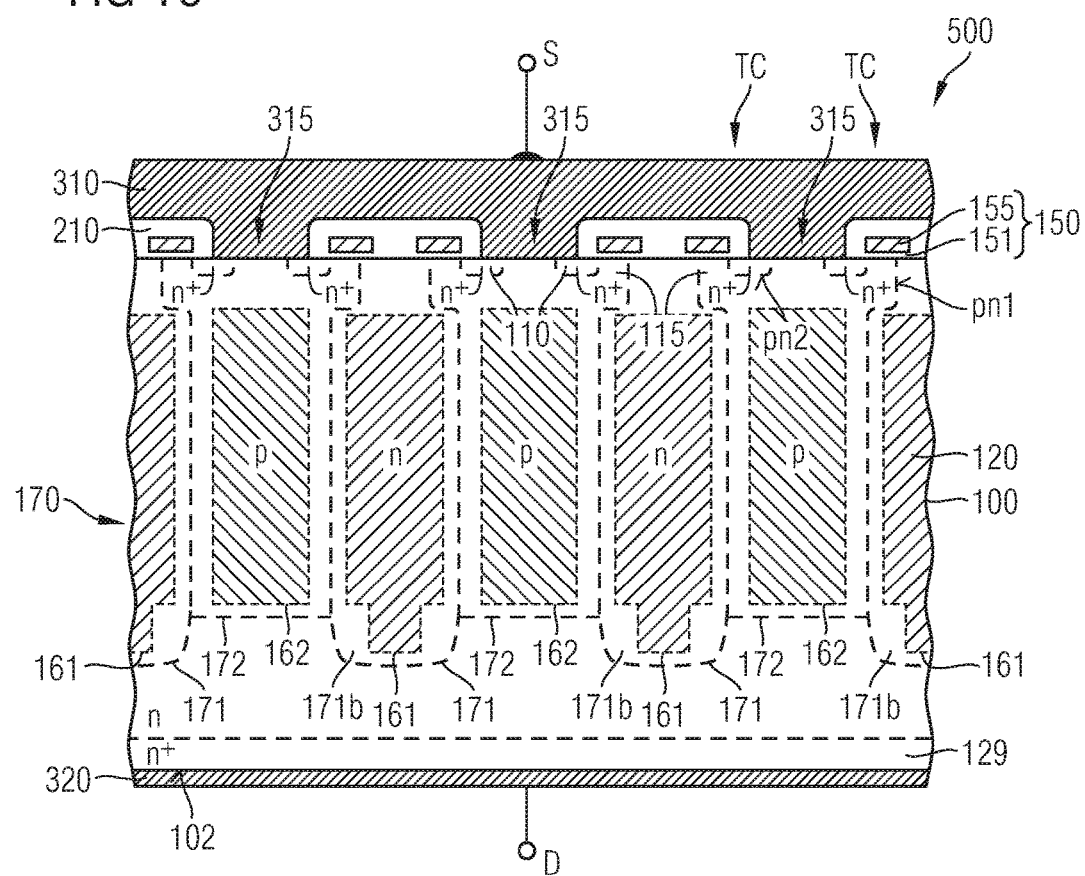
FIG. 16 is a schematic vertical cross-sectional view of a portion of a semiconductor device according to an embodiment including vertical extensions of n-type semiconductor regions of a superjunction structure.

FIG. 16 shows a superjunction semiconductor device 500 with vertical extensions 171b of the n-type semiconductor regions 171 resulting from one of the processes described with reference to FIG. 10. The vertical extensions 171b may improve charge carrier flow to the drain layer 130 below the n-type semiconductor regions 171.

The superjunction semiconductor device 500 of FIG. 17 combines a superjunction structure 170 as described above with at least one further superjunction structure 180, wherein the two superjunction structures 170, 180 are stacked on each other. Complementary doped first and second regions 181, 182 of the further superjunction structure 180 may result from a sequence of epitaxial processes and implants or from a further trench approach. The second regions 182 of the further superjunction structure 180 may float, may be electrically connected through conductive connection structures in another cross-sectional plane, or may be directly electrically and structurally connected with the p-type semiconductor regions 172.

The superjunction structures 170, 180 may be aligned to each other or may be formed independently from each other. For example, the center-to-center distances between the first and second regions 181, 182 of the second superjunction structure 180 may be or may not be the same or whole-number multiples of the center-to-center distances between the first and second semiconductor regions 171, 172 of the superjunction structure 170. Longitudinal axes of the first and second regions 181, 182 of the second superjunction structure 180 may be parallel or tilted to longitudinal axes of the first and second semiconductor regions 171, 172 of the superjunction structure 170. According to an embodiment a tilt angle between the longitudinal axes of the first and second regions 181, 182 of the second superjunction structure 180 and the first and second semiconductor regions 171, 172 of the superjunction structure 170 may be 90°.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device, comprising:
    a semiconductor portion that comprises a drift layer comprising first semiconductor regions of a first conductivity and second semiconductor regions of an opposite second conductivity type,
    wherein the first semiconductor regions are disposed in first trenches formed in the semiconductor portion,
    wherein the second semiconductor regions are disposed in second trenches formed in the semiconductor portion,
    wherein the first and second semiconductor regions alternate along at least one horizontal direction parallel to a first surface of the semiconductor portion,
    wherein surfaces that connect points of equal dopant concentration in the first and second semiconductor regions are not undulated, and
    wherein at half a distance between vertical center axes of neighboring first and second semiconductor regions a concentration of dopants of the first conductivity type is at most 30% of a maximum dopant concentration in the first semiconductor regions.

2. The superjunction semiconductor device of claim 1, wherein at half the distance between vertical center axes of directly adjoining first and second semiconductor regions the dopant concentration of dopants of the first conductivity type is at most 15% of the maximum dopant concentration in the first semiconductor regions.

3. The superjunction semiconductor device of claim 1, further comprising:
    a second superjunction structure stacked with a first superjunction structure comprising the first and second semiconductor regions.

4. The superjunction semiconductor device of claim 1, wherein the drift layer has the first conductivity type and a vertical extension of the first semiconductor regions is greater than a vertical extension of the second semiconductor regions.

5. The superjunction semiconductor device of claim 1, wherein a dopant concentration per unit area in both the first and second semiconductor regions locally changes with decreasing distance to a lateral surface of the semiconductor portion.

6. The superjunction semiconductor device of claim 1, wherein a dopant concentration per unit area in the first or the second semiconductor regions locally changes with respect to a dopant concentration per unit area in the other of the second and first semiconductor regions with decreasing distance to a lateral surface of the semiconductor portion.

7. The superjunction semiconductor device of claim 1, wherein portions of the drift layer separate neighboring first and second semiconductor regions.

8. The superjunction semiconductor device of claim 1, wherein the first and second semiconductor regions alternate along two orthogonal horizontal directions.

9. A super junction semiconductor device, comprising:
    a semiconductor portion that comprises a drift layer comprising first semiconductor regions of a first conductivity and second semiconductor regions of an opposite second conductivity type,
    wherein the first and second semiconductor regions alternate along at least one horizontal direction parallel to a first surface of the semiconductor portion,
    wherein surfaces that connect points of equal dopant concentration in the first and second semiconductor regions are not undulated, and
    wherein at a pn junction between directly adjoining first and second semiconductor regions a concentration of dopants of the first conductivity type is at most 30% of a maximum dopant concentration in the first semiconductor regions.

* * * * *